United States Patent
Nonomura

(10) Patent No.: US 12,163,226 B2
(45) Date of Patent: Dec. 10, 2024

(54) SUBSTRATE PROCESSING APPARATUS, REACTION CONTAINER, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventor: Kazuki Nonomura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 234 days.

(21) Appl. No.: 17/478,510

(22) Filed: Sep. 17, 2021

(65) Prior Publication Data

US 2022/0002871 A1 Jan. 6, 2022

Related U.S. Application Data

(63) Continuation of application No. PCT/JP2019/035877, filed on Sep. 12, 2019.

(30) Foreign Application Priority Data

Mar. 20, 2019 (JP) .................... 2019-052810

(51) Int. Cl.
 *C23C 16/455* (2006.01)
 *C23C 16/46* (2006.01)
 (Continued)

(52) U.S. Cl.
 CPC .. *C23C 16/45563* (2013.01); *C23C 16/45587* (2013.01); *C23C 16/46* (2013.01);
 (Continued)

(58) Field of Classification Search
 CPC .......... C23C 16/45546; C23C 16/4583; C23C 16/45587; C23C 16/45563; C23C 16/46;
 (Continued)

(56) References Cited

U.S. PATENT DOCUMENTS

| 5,503,678 A | 4/1996 | Usami |
| 2009/0016854 A1* | 1/2009 | Morohashi ........ H01L 21/67017 |
| | | 414/161 |

(Continued)

FOREIGN PATENT DOCUMENTS

| CN | 107240567 A | 10/2017 |
| JP | 02-130925 A | 5/1990 |

(Continued)

OTHER PUBLICATIONS

Chinese Office Action issued on Jul. 13, 2023 for Chinese Patent Application No. 201980093547.1.

(Continued)

*Primary Examiner* — Yuechuan Yu
(74) *Attorney, Agent, or Firm* — Volpe Koenig

(57) ABSTRACT

There is provided a technique that includes: a reaction container into which a substrate support including a substrate support region configured to support a substrate and a heat insulator provided below the substrate support region are inserted; a gas supplier configured to supply a gas into the reaction container; and a protruding portion protruding inward from an inner wall of the reaction container on an upper surface side of the heat insulator in a region of the inner wall of the reaction container where the gas supplier and the substrate support do not face each other.

18 Claims, 21 Drawing Sheets

(51) Int. Cl.
*H01L 21/02* (2006.01)
*H10B 12/00* (2023.01)
*C23C 16/44* (2006.01)

(52) U.S. Cl.
CPC ........ *H01L 21/02112* (2013.01); *H10B 12/00* (2023.02); *C23C 16/4412* (2013.01)

(58) Field of Classification Search
CPC ........... C23C 16/4412; H01L 21/02112; H01L 21/02178; H01L 21/31; H01L 21/67017; H01L 21/0228; H01L 21/67103; H10B 12/00

See application file for complete search history.

(56) References Cited

U.S. PATENT DOCUMENTS

| | | | |
|---|---|---|---|
| 2009/0029561 | A1 | 1/2009 | Fukuda et al. |
| 2017/0287681 | A1 | 10/2017 | Nitadori et al. |
| 2018/0286662 | A1 | 10/2018 | Nagatomi et al. |

FOREIGN PATENT DOCUMENTS

| | | |
|---|---|---|
| JP | 07-130662 A | 5/1995 |
| JP | 2003-218101 A | 7/2003 |
| JP | 2007-095923 A | 4/2007 |
| JP | 2009-032890 A | 2/2009 |
| JP | 2018-078323 A | 5/2018 |
| JP | 2018-166142 A | 10/2018 |
| JP | 2019-004096 A | 1/2019 |

OTHER PUBLICATIONS

International Search Report and English Translation, PCT/JP2019/035877, Dec. 10, 2019 (5 pg.).

Korean Office Action issued on Nov. 16, 2023 for Korean Patent Application No. 10-2021-7030317.

* cited by examiner

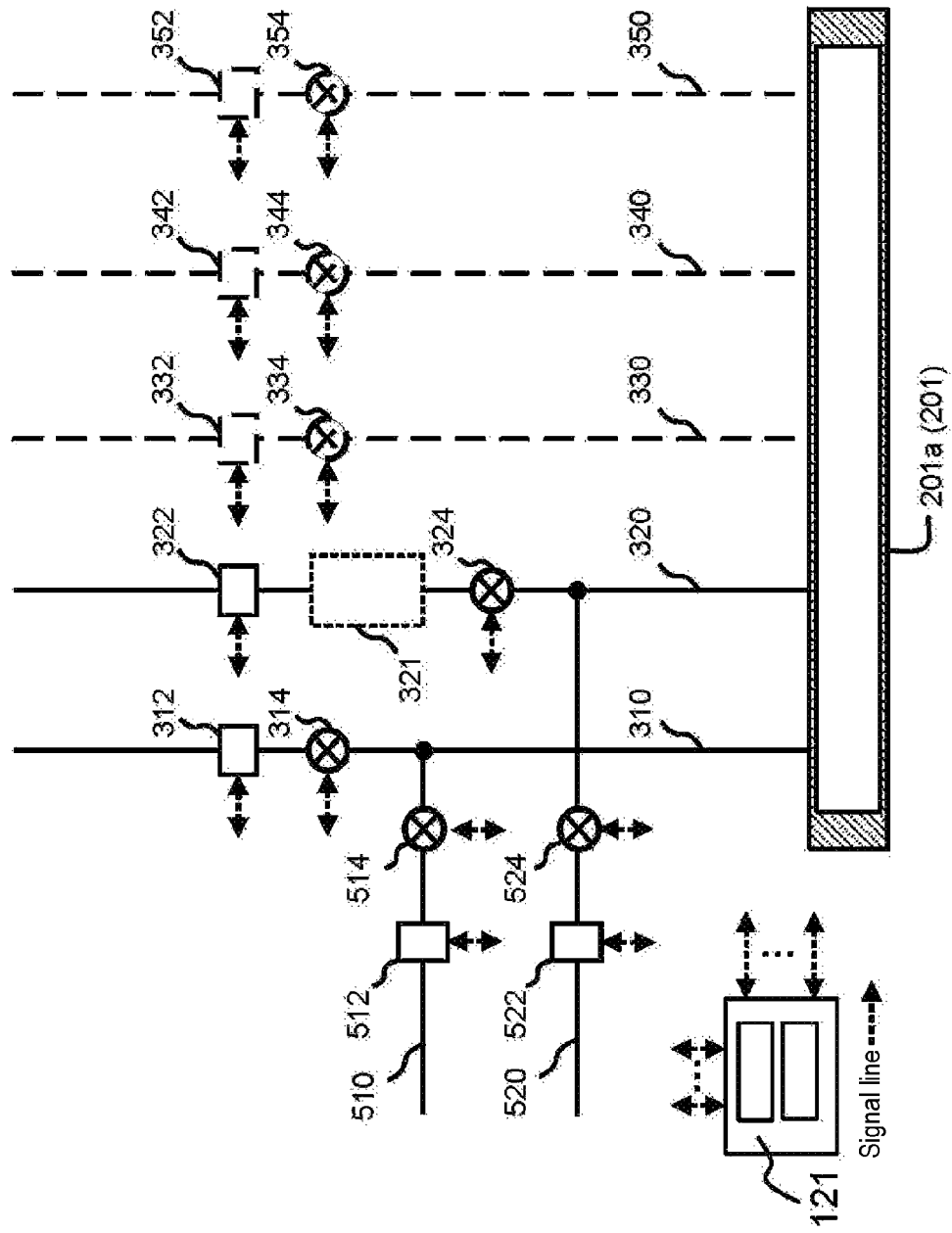

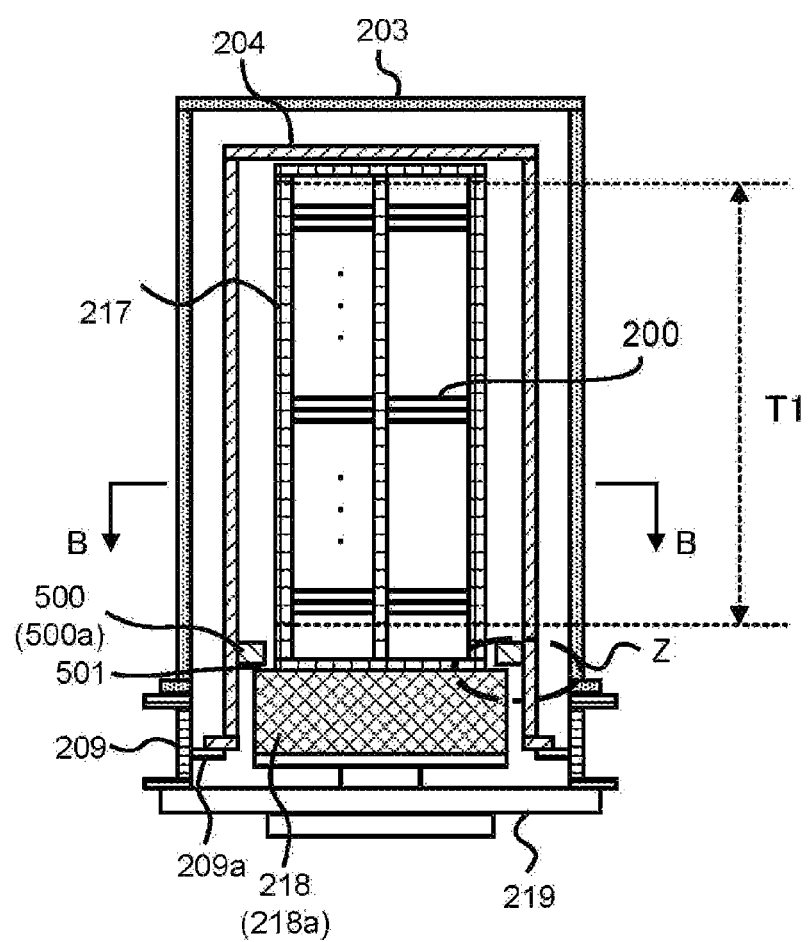

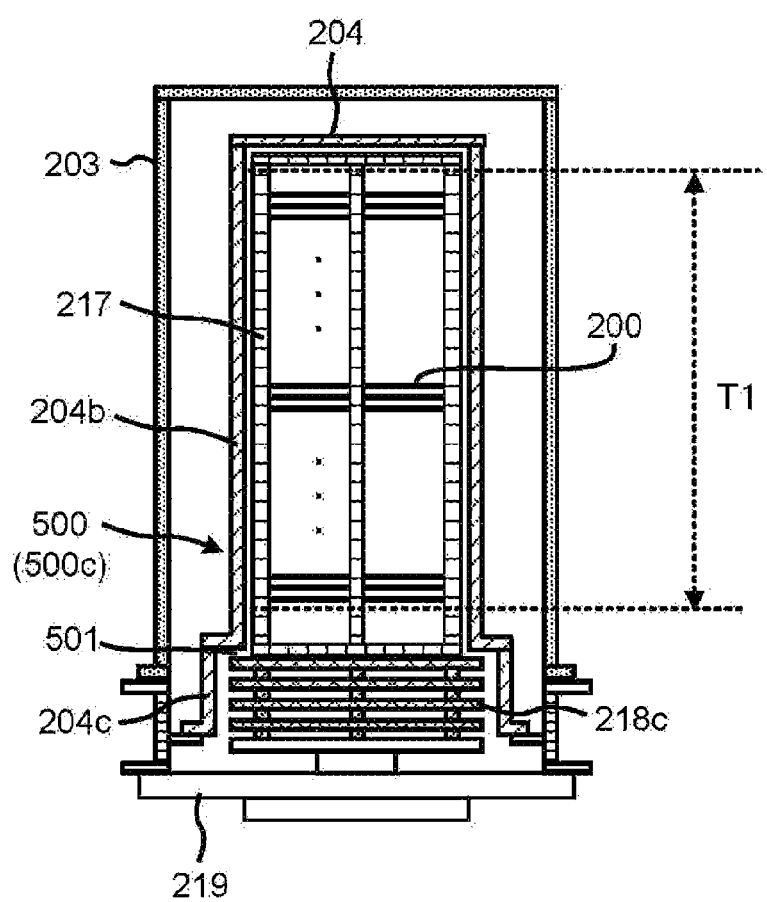

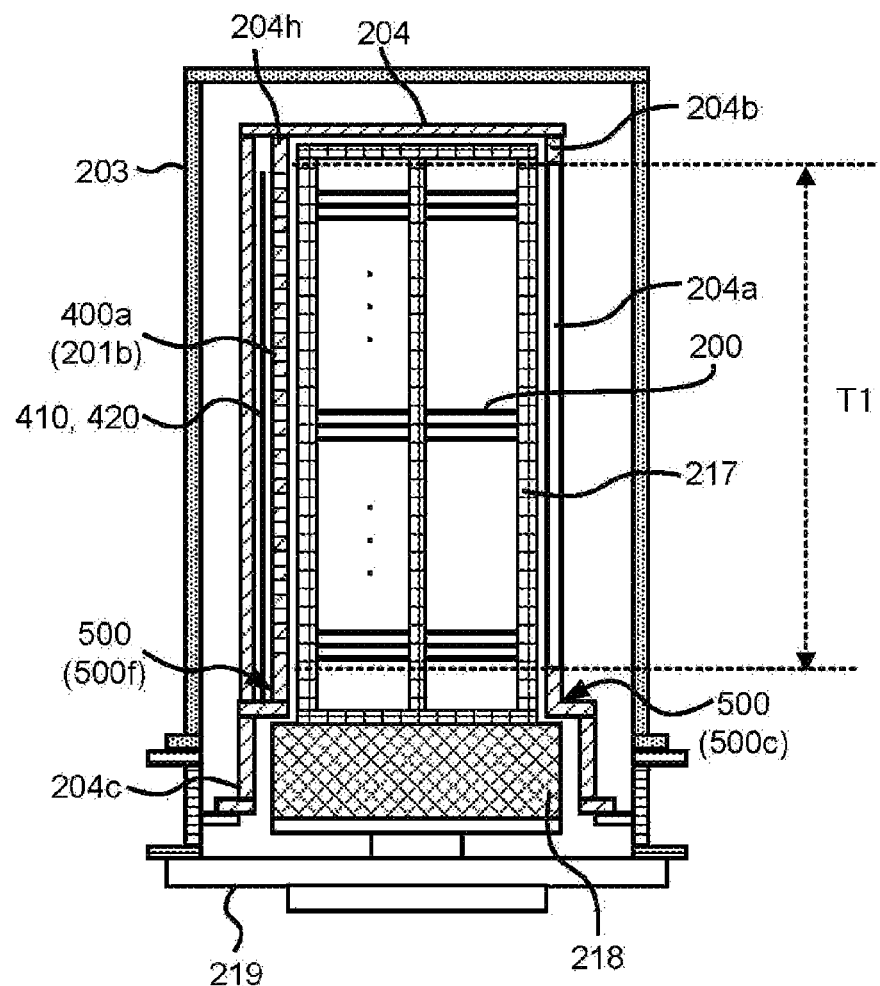

SUBSTRATE PROCESSING APPARATUS, REACTION CONTAINER, METHOD OF MANUFACTURING SEMICONDUCTOR DEVICE, AND RECORDING MEDIUM

CROSS-REFERENCE TO RELATED APPLICATION

The application is a Bypass Continuation Application of PCT International Application No. PCT/JP2019/035877, filed on Sep. 12, 2019 and designating the United States, the international application being based upon and claiming the benefit of priority from Japanese Patent Application No. 2019-052810, filed on Mar. 20, 2019, the entire content of which is incorporated herein by reference.

TECHNICAL FIELD

The present disclosure relates to a substrate processing apparatus, a reaction container, a method of manufacturing a semiconductor device, and a recording medium.

BACKGROUND

As a process of manufacturing a semiconductor device, a film-forming process of forming a film on a substrate accommodated in a process chamber may be performed.

In a substrate processing apparatus that performs a process of manufacturing a semiconductor device, a manufacturing throughput may have to be improved.

SUMMARY

Some embodiments of the present disclosure provide a technique capable of improving a manufacturing throughput of a substrate processing apparatus.

According to some embodiments of the present disclosure, there is provided a technique that includes: a reaction container into which a substrate support including a substrate support region configured to support a substrate and a heat insulator provided below the substrate support region are inserted; a gas supplier configured to supply a gas into the reaction container; and a protruding portion protruding inward from an inner wall of the reaction container on an upper surface side of the heat insulator in a region of the inner wall of the reaction container where the gas supplier and the substrate support do not face each other.

BRIEF DESCRIPTION OF DRAWINGS

The accompanying drawings, which are incorporated in and constitute a part of the specification, illustrate embodiments of the present disclosure.

FIG. 3 is a schematic configuration diagram of a gas supply system of a substrate processing apparatus used in embodiments of the present disclosure.

FIG. 4A is a schematic configuration diagram of a vertical process furnace of a substrate processing apparatus used in embodiments of the present disclosure, in which a process furnace portion is shown in a vertical cross-sectional view.

FIG. 9B is a schematic configuration diagram of another modification of a vertical process furnace of a substrate processing apparatus used in embodiments of the present disclosure.

FIG. 10 is a schematic configuration diagram of another modification of a vertical process furnace of a substrate processing apparatus used in embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to obscure aspects of the various embodiments.

Hereinafter, embodiments of the present disclosure will be described with reference to FIGS. 1 to 3, 4A, 4B, 7A, and 13. The substrate processing apparatus 10 is configured as an example of an apparatus used in a semiconductor device manufacturing process.

(1) Configuration of Substrate Processing Apparatus

Figure 1:
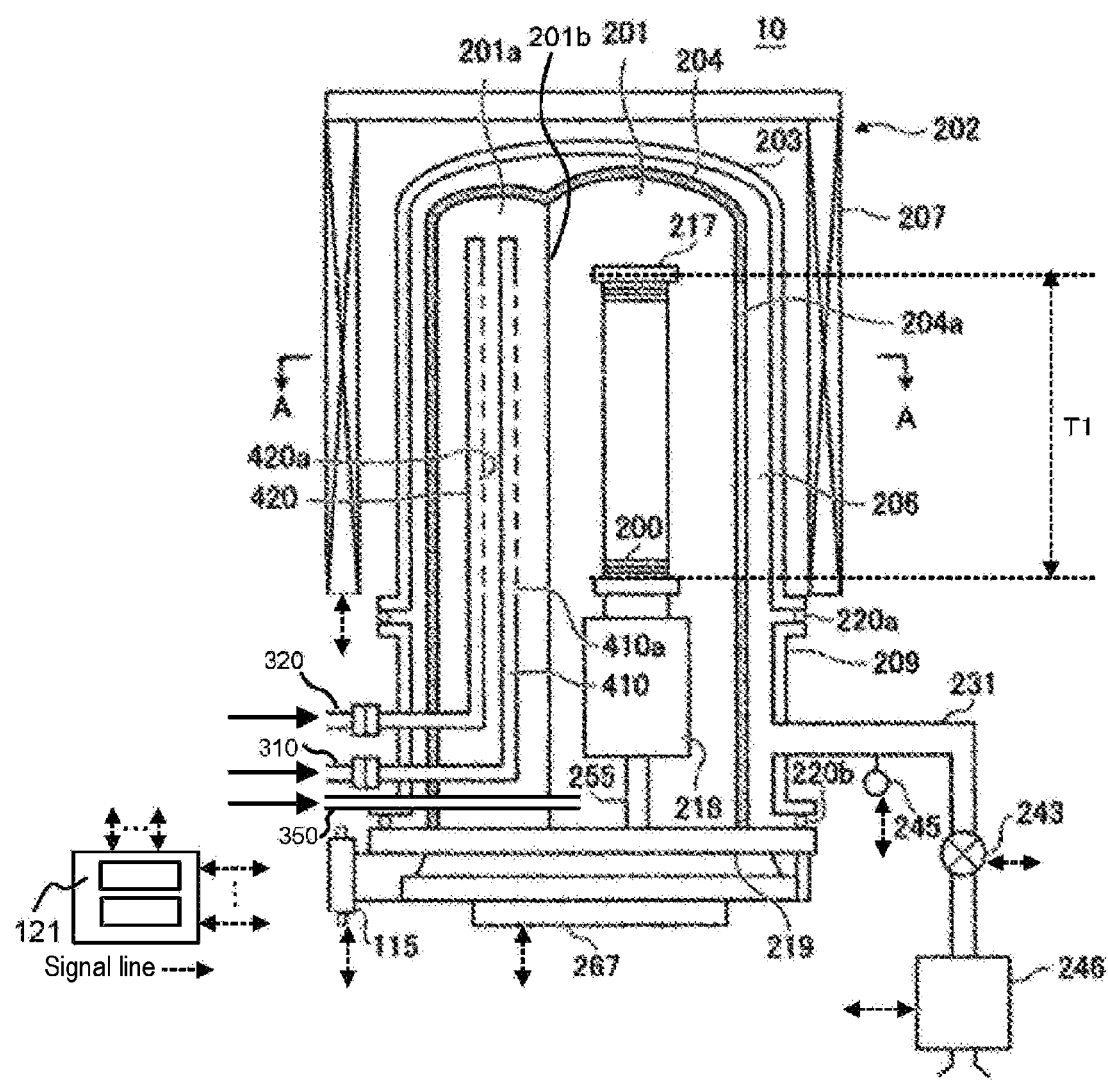
FIG. 1 is a schematic configuration diagram of a vertical process furnace of a substrate processing apparatus used in embodiments of the present disclosure, in which a process furnace portion is shown in a vertical cross-sectional view.

As shown in FIG. 1, the substrate processing apparatus 10 includes a process furnace 202 provided with a heater 207 as a heating means (heating mechanism or heating system). The heater 207 has a cylindrical shape, and is vertically installed by being supported on a heater base (not shown) as a holding plate. The heater 207 also functions as an activation mechanism (excitation part) configure to thermally activate (excite) a gas.

Inside the heater 207, a reaction tube constituting a reaction container (process container) is arranged concentrically with the heater 207. The reaction tube has a double tube configuration including an inner tube 204 and an outer tube 203 that concentrically surrounds the inner tube 204. The inner tube 204 and the outer tube 203 are made of a heat-resistant material such as quartz ($SiO_2$), silicon carbide (SiC) or the like, and are formed in a cylindrical shape with an upper end closed and a lower end opened.

A process chamber 201 in which wafers 200 as substrates are processed is formed in the hollow portion of the inner tube 204 (inside the reaction container). The process chamber 201 is configured to be capable of accommodating the wafers 200 in a state in which the wafers 200 are arranged from one end side (lower side) to the other end side (upper side) in the process chamber 201. The inside of the process chamber 201 may be divided into a plurality of regions. In the embodiments, the region in which the wafers 200 are arranged in the process chamber 201 is also referred to as a substrate arrangement region (wafer arrangement region). The wafer arrangement region is also referred to as a substrate processing region T2 (wafer processing region) and a substrate holding region (wafer holding region). Since the wafer arrangement region is a region where the temperature is kept uniform by the heater 207, the wafer arrangement region is also referred to as a uniform heating region T1 in the present disclosure. Further, in the process chamber 201, a region including the wafer arrangement region and surrounded by the heater 207, i.e., a region having a relatively high temperature in the process chamber 201 is also referred to as a high temperature region. Further, in the process chamber 201, a region not including the wafer arrangement region and not surrounded by the heater 207 (a region around the heat insulator 218 described later), i.e., a region having a relatively low temperature in the process chamber 201 is also referred to as a low temperature region. Specifically, the low temperature region is a region in the process chamber 201 below the upper surface of the heat insulator 218. In addition, a direction in which the wafers 200 are arranged in the process chamber 201 is also referred to as a substrate arrangement direction (wafer arrangement direction).

Below the outer tube 203, a manifold (inlet flange) 209 is arranged concentrically with the outer tube 203. The inner tube 204 and the outer tube 203 are respectively supported from below by the manifold 209. The manifold 209 is made of a metal material such as stainless steel (SUS) or the like, and is formed in a cylindrical shape with upper and lower ends opened. As shown in FIG. 4A, the inner wall of the manifold 209 is provided with an annular flange portion 209a made of a metal material such as SUS or the like and extending radially inward of the manifold 209. The lower end of the inner tube 204 is in contact with the upper surface of the flange portion 209a. The lower end of the outer tube 203 is in contact with the upper end of the manifold 209. As shown in FIG. 1, an O-ring 220a as a seal is provided between the manifold 209 and the outer tube 203. As the manifold 209 is supported by the heater base, the outer tube 203 comes into a vertically installed state. A reaction container mainly includes the outer tube 203, the inner tube 204 and the manifold 209.

A spare chamber (nozzle accommodation chamber) 201a is formed in the hollow portion of the inner tube 204. The spare chamber 201a is formed in a channel shape (groove shape) to protrude radially outward of the inner tube 204 from the side wall of the inner tube 204 and extend along the vertical direction. The inner wall of the spare chamber 201a constitutes a part of the inner wall of the process chamber 201. It may be said that in a plane view, the spare chamber 201a and the process chamber 201 are in fluid communicate with each other through an opening 201b provided at the inner tube 204. The opening 201b is configured as a slit-shaped through-hole.

Figure 2:
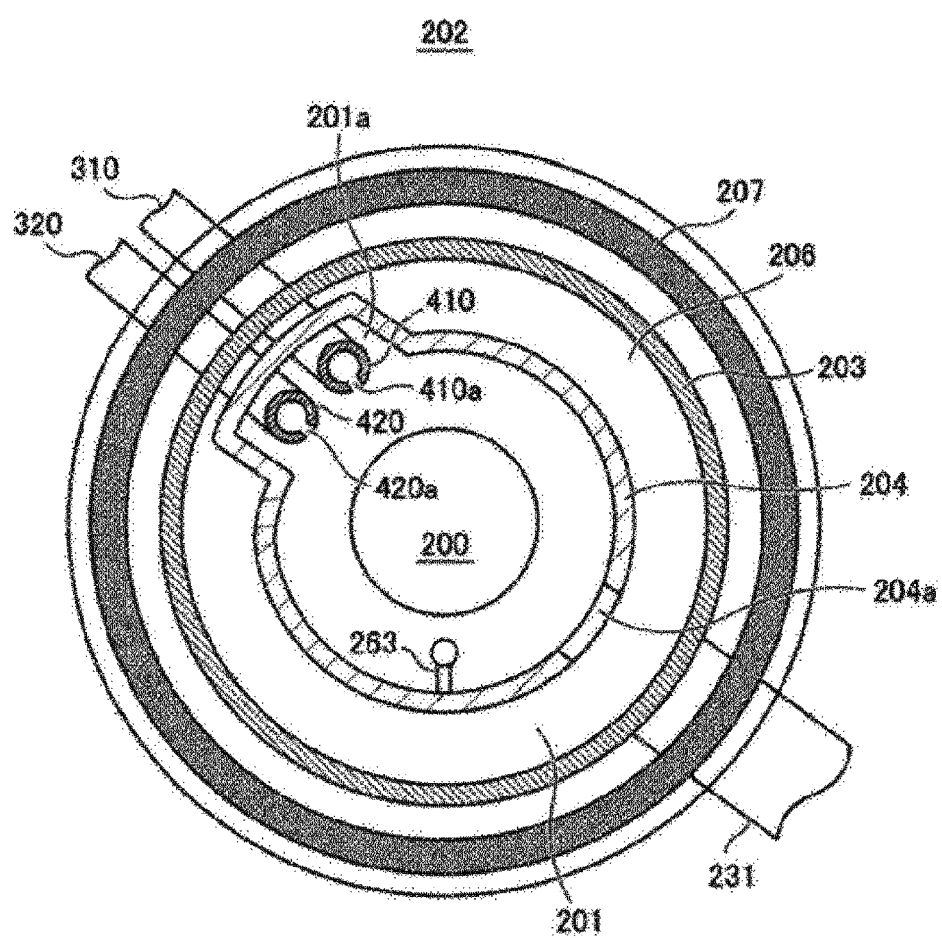
FIG. 2 is a schematic configuration diagram of a vertical process furnace of a substrate processing apparatus used in embodiments of the present disclosure, in which the process furnace portion is shown in a cross-sectional view taken along a line A-A in FIG. 1.

Nozzles 410 and 420 as gas suppliers are accommodated in the spare chamber 201a. Each of the nozzles 410 and 420 is made of a heat-resistant material such as quartz or SiC, and is formed of an L-shaped long nozzle. The horizontal portions of the nozzles 410 and 420 are provided to penetrate the side wall of the manifold 209 and the lower portion of the side wall of the inner tube 204. The vertical portions of the nozzles 410 and 420 are provided to extend upward in the wafer arrangement direction along the upper portion of the inner wall of the spare chamber 201a from the lower portion thereof. That is, as shown in FIG. 2, the nozzles 410 and 420 are installed in the region horizontally surrounding the wafer arrangement region on the lateral side of the wafer arrangement region to extend along the wafer arrangement region. As shown in FIG. 1, the nozzles 410 and 420 are installed such that the height positions of the upper ends of the nozzles reaches a height position near a ceiling of the boat 217, which will be described later. In the present disclosure, the nozzles 410 and 420 are also referred to as a first nozzle and a second nozzle, respectively.

Gas supply holes (openings) 410a and 420a configured to supply gases are formed on the side surfaces of the nozzles 410 and 420, respectively. The gas supply holes 410a and 420a of the nozzles 410 and 420 are provided from the upper portions to the lower portions of the nozzles 410 and 420 at positions facing the wafers 200, i.e., over the entire wafer arrangement region in the wafer arrangement direction. That is, the gas supply holes 410a and 420a are formed at height positions from the lower portion to the upper portion of a boat 21 to be described below, and are configured to be capable of injecting gases to all the wafers 200 accommodated in the boat 217.

The gas supply holes 410a and 420a are opened to face the center of the process chamber 201, and are configured to be capable of injecting gases toward the wafers 200. The gas supply holes 410a and 420a have the same opening area and are provided at the same opening pitch. However, the gas supply holes 410a and 420a are not limited to such a form.

For example, the opening area of the gas supply holes 410a and 420a may be gradually increased from the upstream side (the lower portion of the inner tube 204) to the downstream side (the upper portion of the inner tube 204), or the opening pitch of the gas supply holes 410a and 420a may be gradually reduced from the upstream side to the downstream side. As a result, it is possible to inject a gas having substantially the same flow rate from the respective gas supply holes 410a and 420a. That is, it is possible to make uniform the flow rate of the gas supplied from the gas supply holes 410a and 420a.

In the embodiments, a gas is conveyed via the nozzles 410 and 420 arranged in the spare chamber 201a, which is a cylindrical space. Then, the gas is injected into the process chamber 201 from the gas supply holes 410a and 420a opened in the nozzles 410 and 420, respectively. The main flow of the gas in the inner tube 204 is set to be in a direction parallel to the surface of the wafer 200, i.e., in a horizontal direction. With such a configuration, it is possible to uniformly supply the gas to the respective wafers 200. The gas flowing on the surface of the wafer 200 flows toward an exhaust hole 204a to be described below. However, a direction of this gas flow is appropriately specified by a position of the exhaust hole 204a, and is not limited to the horizontal direction.

Gas supply pipes 310 and 320 are connected to the nozzles 410 and 420. In this way, two nozzles 410 and 420 and two gas supply pipes 310 and 320 are connected to the inner tube 204, such that a plurality of types of gas, two types of gases in the embodiments, may be supplied into the process chamber 201.

A gas supply pipe 350 is connected to the lower portion of the manifold 209. The gas supply pipe 350 is provided to penetrate the lower portions of the side walls of the manifold 209 and the inner tube 204.

As shown in FIG. 3, mass flow controllers (MFCs) 312, 322 and 352, which are flow rate controllers (flow rate control parts), and valves 314, 324 and 354, which are opening/closing valves, are respectively installed at the gas supply pipes 310, 320 and 350 sequentially from corresponding upstream sides of the gas flow. Gas supply pipes 510 and 520 are connected to the gas supply pipes 310 and 320, respectively, at the downstream sides of the valves 314 and 324. MFCs 512 and 522 and valves 514 and 524 are respectively installed at the gas supply pipes 510 and 520 sequentially from corresponding upstream sides of the gas flow.

From the gas supply pipe 310, a precursor gas which is a processing gas, for example, a gas containing aluminum (Al) as a main element (a predetermined element or a metal element) constituting a film formed on the wafer 200, i.e., an Al-containing gas (a metal-containing gas, a metal-containing precursor gas or an Al-containing precursor gas) may be supplied to the wafer process region in the process chamber 201 via the MFC 312, the valve 314 and the nozzle 410. The precursor gas refers to a precursor kept in a gaseous state, for example, a gas obtained by vaporizing a precursor kept in a liquid state under the room temperature and the atmospheric pressure, a precursor kept in a gaseous state under the room temperature and the atmospheric pressure, and the like. The Al-containing gas acts as a film-forming gas, i.e., an Al source. As the Al-containing gas, it may be possible to use, for example, an organic precursor gas containing Al and carbon (C). As the Al-containing gas, it may be possible to use, for example, a trimethylaluminum ($Al(CH_3)_3$, abbreviation: TMA) gas. The TMA gas is an organic precursor gas containing alkyl aluminum in which an alkyl group is bonded to Al.

From the gas supply pipe 320, a reaction gas (reactant) which is a processing gas, for example, an oxygen (O)-containing gas may be supplied to the wafer processing region in the process chamber 201 via the MFC 322, the valve 324 and the nozzle 420. The O-containing gas acts as a film-forming gas, i.e., an O source (an oxidizing gas or an oxidizing agent). As the O-containing gas, it may be possible to use, for example, an ozone ($O_3$) gas.

From the gas supply pipes 510 and 520, an inert gas, for example, a nitrogen ($N_2$) gas may be supplied to the wafer processing region in the process chamber 201 via the MFCs 512 and 522, the valves 514 and 524 and the nozzles 410 and 420, respectively. The $N_2$ gas acts as a purge gas, a dilution gas or a carrier gas.

From the gas supply pipe 350, an inert gas, for example, a $N_2$ gas may be supplied to the low temperature region in the process chamber 201 via the MFC 352 and the valve 354. The $N_2$ gas acts as a purge gas.

A precursor gas supply system (metal-containing precursor gas supply system) mainly includes the gas supply pipe 310, the MFC 312, and the valve 314. The nozzle 410 may be included in the precursor gas supply system. A reaction gas supply system (oxygen-containing gas supply system) mainly includes the gas supply pipe 320, the MFC 322 and the valve 324. The nozzle 420 may be included in the reaction gas supply system. The precursor gas supply system and the reaction gas supply system may be collectively considered as a processing gas supply system (gas supply system). Further, at least one selected from the group of the precursor gas supply system and the reaction gas supply system may be considered as a processing gas supplier. A first inert gas supply system (a purge gas supply system, a dilution gas supply system or a carrier gas supply system) mainly includes the gas supply pipes 510 and 520, the MFCs 512 and 522, and the valves 514 and 524. A second inert gas supply system (purge gas supply system) mainly includes the gas supply pipe 350, the MFC 352 and the valve 354.

As shown in FIG. 1, on the side wall of the inner tube 204, for example, an exhaust hole (exhaust slit) 204a configured as a slit-shaped through-hole is elongated in the vertical direction. The exhaust hole 204a is, for example, rectangular in a front view, and is provided from the lower portion to the upper portion of the side wall of the inner tube 204 to correspond to the entire wafer arrangement region in the wafer arrangement direction. The exhaust hole 204a is not limited to being configured as a slit-shaped through-hole, and may be configured by a plurality of holes. The inside of the process chamber 201 and the exhaust passage 206 formed by the annular space (gap) between the inner tube 204 and the outer tube 203 are in fluid communication with each other through the exhaust hole 204a.

As shown in FIG. 2, in a plane view, the spare chamber 201a and the exhaust hole 204a face each other across the centers of the wafers 200 accommodated in the process chamber 201 (have positions opposite to each other by 180 degrees). Further, the nozzles 410 and 420 and the exhaust hole 204a face each other across the centers of the wafers 200 accommodated in the process chamber 201.

As shown in FIG. 1, an exhaust pipe 231 configured to exhaust the atmosphere in the process chamber 201 is connected to the manifold 209 via an exhaust passage 206. A vacuum pump 246 as a vacuum evacuation device is connected to the exhaust pipe 231 via a pressure sensor 245 as a pressure detector (pressure detection part) configured to detect the pressure in the exhaust passage 206, i.e., the pressure in the process chamber 201, and an APC (Auto Pressure Controller) valve 243 as a pressure regulator (pressure regulation part). The APC valve 243 is configured such that vacuum evacuation and vacuum evacuation stop for the inside of the process chamber 201 may be performed by opening and closing the APC valve 243 while operating the vacuum pump 246, and such that the pressure in the process chamber 201 may be regulated by adjusting valve opening state of the APC valve 243 based on the pressure information detected by the pressure sensor 245 while operating the vacuum pump 246. An exhaust system, i.e., an exhaust line mainly includes the exhaust pipe 231, the APC valve 243, and the pressure sensor 245. The exhaust hole 204a, the exhaust passage 206 and the vacuum pump 246 may be included in the exhaust system.

The lower end opening of the manifold 209 is configured as a furnace opening of the process furnace 202. When the boat 217 is raised by the boat elevator 115 described below, the lower end opening of the manifold 209 is hermetically sealed by a seal cap 219 as a lid via an O-ring 220b. The seal cap 219 is made of a metal material such as SUS or the like and is formed in a disc shape. Below the seal cap 219, a rotation mechanism 267 configured to rotate the boat 217 is installed. The rotary shaft 255 of the rotation mechanism 267 penetrates the seal cap 219 and is connected to the boat 217. The rotation mechanism 267 is configured to rotate the wafers 200 by rotating the boat 217. The seal cap 219 is configured to be vertically raised or lowered by a boat elevator 115 as an elevating mechanism vertically installed outside the outer tube 203. The boat elevator 115 is configured as a transfer device (transfer mechanism) configured to load or unload (transfer) the wafers 200 supported by the boat 217 into or out of the process chamber 201 by raising or lowering the seal cap 219.

The boat 217 serving as a substrate support has a substrate support region configured to support a plurality of wafers 200, for example, 25 to 200 wafers 200, in such a state that the wafers 200 are arranged in a horizontal posture and in multiple stages along a vertical direction with centers of the wafers 200 aligned with one another. That is, the substrate support region is configured to arrange the wafers 200 in a spaced-apart relationship. Further, the boat 217 includes a heat insulator support region configured to support the heat insulator 218 and provided at the lower part (lower side) of the substrate support region. Product wafers, dummy wafers, fill dummy wafers and the like are supported as the wafers 200 in the substrate support region of the boat 217. The boat 217 is made of a heat-resistant material such as quartz or SiC. As shown in FIG. 4A, a heat insulating cylinder 218a as a heat insulator 218 formed as a cylindrical member by a heat-resistant material such as quartz or SiC is provided at the heat insulator support region of the boat 217. The outer diameter (diameter) of the heat insulating cylinder 218a is larger than the outer diameter (diameter) of the boat 217. That is, in a plane view, the outer peripheral portion of the heat insulating cylinder 218a protrudes radially outward (toward the inner wall of the inner tube 204) from the boat 217 (support columns thereof). The heat insulating cylinder 218a makes it difficult for the heat to be transferred from the heater 207 to the seal cap 219. The heat insulating cylinder 218a may have an internal space, and a heater (not shown) may be provided at the internal space. In this case, the heat insulating cylinder 218a may also be referred to as a heat retaining cylinder. By making the outer diameter (diameter) of the heat insulating cylinder 218a larger than the outer diameter (diameter) of the boat 217, the distance between the heat insulating cylinder 218a and the inner wall of the inner tube 204 is shortened. This makes it possible to suppress the adhesion of a film to the portion of the inner wall of the inner tube 204 facing the side surface of the heat insulating cylinder 218a.

Figure 4B:
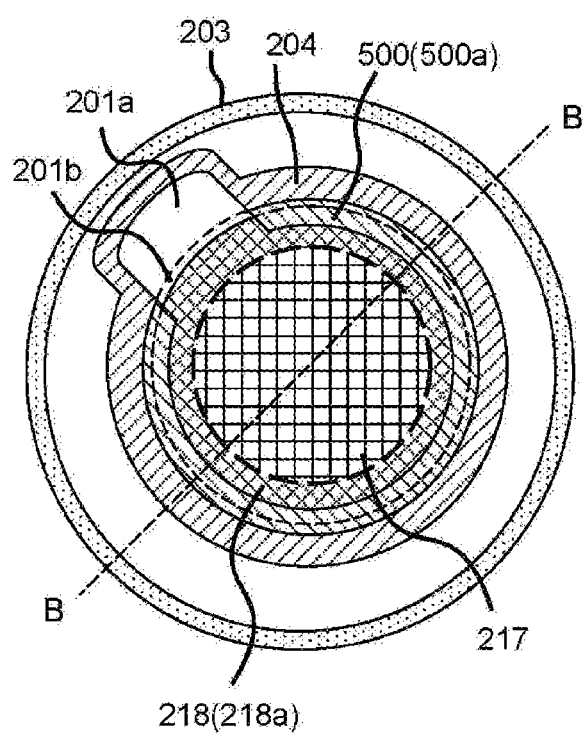
FIG. 4B is a cross-sectional view taken along a line B-B in FIG. 4A.

As shown in FIGS. 4A and 4B, a flange portion 500a as a protruding portion 500 protruding radially inward of the inner tube 204 is provided at the inner wall of the inner tube 204. The flange portion 500a is provided below the portion of the boat 217 facing the substrate support region. Specifically, the flange portion 500a is provided at a position below the wafer arrangement region and above the height position of the upper surface of the heat insulating cylinder 218a. The flange portion 500a is provided such that the inner peripheral portion of the bottom surface (also referred to as a lower end bottom surface) of the flange portion 500a faces the outer peripheral portion (also referred to as an outer upper surface) of the upper surface of the heat insulating cylinder 218a. That is, the flange portion 500a is configured such that the inner peripheral portion of the bottom surface of the flange portion 500a and the outer peripheral portion of the upper surface of the heat insulating cylinder 218a overlap with each other in the plane view. Further, the flange portion 500a is provided such that the flange portion 500a does not make contact with the boat 217 and the heat insulating cylinder 218a. The flange portion 500a may be integrally formed with the inner tube 204, or may be formed separately.

By providing the flange portion 500a, the space between the bottom surface of the flange portion 500a and the upper surface of the heat insulating cylinder 218a constitutes a gas flow path 501 having a small conductance (a large flow resistance). As a result, it is possible to reduce an amount of the processing gas supplied to the wafer arrangement region and entering the low temperature region (e.g., the region that horizontally surrounds the side surface (outer peripheral surface) of the heat insulating cylinder 218a). That is, it is possible to suppress the processing gas from entering the low temperature region. As a result, it is possible to suppress deposition (accumulation) of a film or a reaction by-product, i.e., the adhesion of the by-product on surfaces of members installed in the process chamber 201 (also referred to as "members in the process chamber 201"), specifically members installed in the low temperature region in the process chamber 201 (also referred to as "members in the low temperature region"), for example, the lower portion of the inner wall of the inner tube 204, the inner wall of the manifold 209, the upper surface of the seal cap 219, the side surface of the rotary shaft 255, the upper surface and the side surface of the heat insulating cylinder 218a, and the like.

Further, by forming the gas flow path 501, it is possible to reduce an amount of the inert gas supplied from the gas supply pipe 350 into the low temperature region and diffused into (entering) the wafer processing region. That is, it is also possible to suppress the diffusion of the inert gas into the wafer processing region. As a result, in the film-forming process to described below, the processing gas supplied to the wafers 200 arranged in the lower region (bottom zone) of the wafer arrangement region in the wafer arrangement direction may be suppressed from being diluted with the inert gas otherwise diffused into the wafer processing region so that a concentration of the processing gas becomes lower than a concentration of the processing gas supplied to the wafers 200 arranged in the central region (center zone) or the upper region (top zone) of the wafer arrangement region in the wafer arrangement direction. As a result, the concentration of the processing gas supplied to the respective wafers 200 may be easily made uniform among the wafers 200, thereby improving the inter-wafer uniformity in the film-forming process. Further, it is possible to suppress an in-plane film thickness uniformity of the thin film formed on the wafer 200 from being deteriorated due to a decrease in the concentration of the processing gas supplied to the wafers 200 arranged in the bottom zone (an insufficient supply amount of the processing gas. When the term "uniformity of the film-forming process" is used herein, it may refer to "inter-wafer uniformity of the film-forming process," "in-plane film thickness uniformity of the thin film formed on the wafer 200," or both.

The bottom surface of the flange portion 500a is formed to be parallel to the upper surface of the heat insulating cylinder 218a. Thus, a width of the gas flow path 501 may be made as small as possible, whereby it is possible to decrease a conductance of the gas flow path 501 endlessly (increase a flow resistance endlessly). As a result, it is possible to reliably suppress the entry of the processing gas into the low temperature region and the diffusion of the inert gas into the wafer processing region.

The flange portion 500a may be provided at the inner wall of the inner tube 204 to be continuous in the circumferential direction surrounding the low temperature region. That is, the flange portion 500a may be formed over the entire circumference of the inner wall of the inner tube 204. This makes it possible to reliably suppress the entry of the processing gas into the low temperature region. However, a region near the opening 201b is a region where by-products are unlikely to adhere, because the gas having a relatively high flow velocity immediately after being injected from the nozzles 410 and 420 passes through the region. Further, a region in the spare chamber 201a is also a region where by-products are less likely to adhere than the inside of the process chamber 201. Therefore, as shown in FIG. 4B, the flange portion 500a may not be installed in the opening 201b and the spare chamber 201a.

Figure 7A:
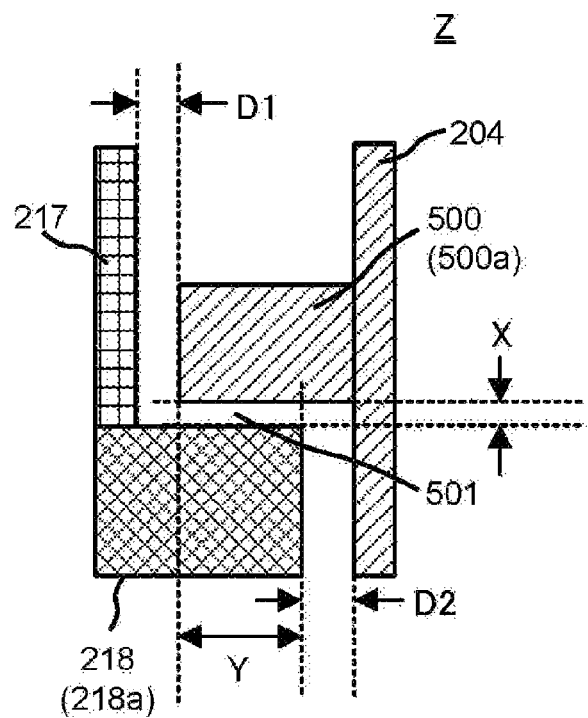
FIG. 7A is an enlarged schematic diagram of region Z indicated by a one-dot chain line in FIG. 4A.

In the present disclosure, as shown in FIG. 7A, a distance X between the bottom surface of the flange portion 500a and the upper surface of the heat insulating cylinder 218a, i.e., a width of the gas flow path may be set to, for example, 0.01 to 8 mm, specifically 0.01 to 5 mm, more specifically 2 mm.

Further, the distance X may be made shorter than a distance D1 between the boat 217 and the inner surface (inner end surface) of the flange portion 500a (distance X<distance D1). Thus, the conductance of the gas flow path 501 may be made smaller than a conductance of a space between the boat 217 and the flange portion 500a, which makes it possible to reliably suppress the entry of the processing gas into the low temperature region. The distance D1 may be set to, for example, 5 to 10 mm, specifically 7 mm, from the viewpoint of avoiding contact between the boat 217 and the flange portion 500a during rotation of the boat 217.

Further, the distance X may be made shorter than a distance Y between the inner surface of the flange portion 500a and a side surface of the heat insulating cylinder 218a (distance X<distance Y). That is, the distance Y is longer than the distance X. Thus, a length of the gas flow path 501 may be sufficiently secured, whereby it is possible to decrease the conductance of the gas flow path 501 endlessly. As a result, it is possible to more reliably suppress the entry of the processing gas into the low temperature region. The distance Y may be set to, for example, 2 to 15 mm, specifically 4 to 10 mm.

Further, the distance X may be made shorter than a distance D2 between the side surface of the heat insulating cylinder 218a and the inner wall of the inner tube 204 (the inner wall of the inner tube 204 located below the flange portion 500a) (distance X<distance D2). This makes it possible to reliably suppress the diffusion of the inert gas into the wafer processing region. As a result, it is possible to further improve the uniformity of the film-forming process. In the present disclosure, the distance D2 may be substantially equal to the distance D1 (distance D1≈distance D2). Similar to the distance D1, the distance D2 may be set to, for example, 5 to 10 mm, specifically 7 mm, from the viewpoint of avoiding contact between the heat insulating cylinder 218a and the inner tube 204 during rotation of the boat 217.

As shown in FIG. 2, a temperature sensor 263 as a temperature detector is installed in the inner tube 204. By regulating an amount of power supplied to the heater 207 based on the temperature information detected by the temperature sensor 263, the inside of the process chamber 201 has a desired temperature distribution. The temperature sensor 263 is formed in an L shape like the nozzles 410 and 420, and is installed along the inner wall of the inner tube 204.

Figure 13:
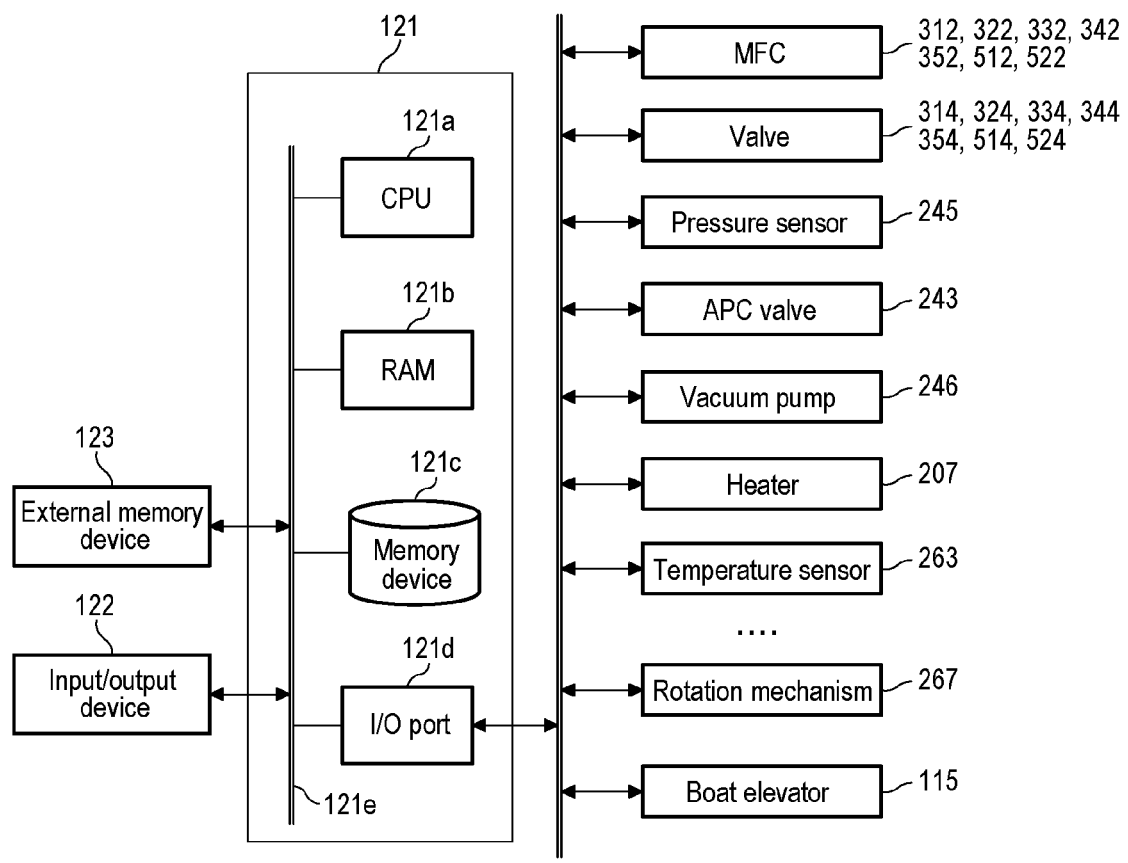
FIG. 13 is a schematic configuration diagram of a controller of a substrate processing apparatus used in embodiments of the present disclosure, in which a control system of the controller is shown in a block diagram.

As shown in FIG. 13, a controller 121 as a control part (control means) is configured as a computer including a CPU (Central Processing Unit) 121a, a RAM (Random Access Memory) 121b, a memory device 121c, and an I/O port 121d. The RAM 121b, the memory device 121c, and the I/O port 121d are configured to be capable of exchanging data with the CPU 121a via an internal bus. An input/output device 122 configured as, for example, a touch panel or the like is connected to the controller 121.

The memory device 121c includes, for example, a flash memory, a hard disc drive (HDD), a solid state drive (SSD) or the like. The memory device 121c readably stores a control program that controls the operation of the substrate processing apparatus, a process recipe in which procedures, conditions, and the like of a method of manufacturing a semiconductor device described below are written, and the like. The process recipe is combined to be capable of obtaining a predetermined result by causing the controller 121 to execute the respective processes (respective steps, respective procedures and respective processes) in the method of manufacturing a semiconductor device described below, and functions as a program. The process recipe functions as a program. Hereinafter, the process recipe, the control program and the like are collectively and simply referred to as a program. Further, the process recipe is also simply referred to as a recipe. As used herein, the term "program" may refer to a case of including the recipe solely, a case of including the control program solely, or both. The RAM 121b is configured as a memory area (work area) in which programs and data read by the CPU 121a, and the like are temporarily stored.

The I/O port 121d is connected to the aforementioned MFCs 312, 322, 352, 512, and 522, the valves 314, 324, 354, 514, and 524, the pressure sensor 245, the APC valve 243, the vacuum pump 246, the heater 207, the temperature sensor 263, the rotation mechanism 267, the boat elevator 115 and the like.

The CPU 121a is configured to read the control program from the memory device 121c and execute the control program thud read. The CPU 121a is also configured to read the recipe from the memory device 121c in response to an operation command inputted from the input/output device 261 or the like. The CPU 121a is configured to control, according to the contents of the recipe thus read, an operation of regulating flow rates of various gases by the MFCs 312, 322, 352, 512 and 522, an opening/closing operation of the valves 314, 324, 354, 514, and 524, an opening/closing operation of the APC valve 243, a pressure regulation operation by the APC valve 243 based on the pressure sensor 245, a temperature regulation operation of the heater 207 based on the temperature sensor 263, start and stop of the vacuum pump 246, rotation and rotation speed adjustment operation of the boat 217 by the rotation mechanism 267, an operation of raising or lowering the boat 217 by the boat elevator 115, an operation of accommodating the wafers 200 in the boat 217, and the like.

The controller 121 may be configured by installing, in a computer, the aforementioned program stored in an external memory device 123. The external memory device 123 includes, for example, a magnetic disc such as the HDD or the like, an optical disc such as a CD or the like, a magneto-optical disc such as a MO or the like, or a semiconductor memory such as a USB memory or the like. The memory device 121c and the external memory device 123 are configured as a computer-readable recording medium. Hereinafter, the memory device 121c and the external memory device 123 are collectively and simply referred to as a recording medium. As used herein, the term "recording medium" may refer to a case of including the memory device 121c solely, a case of including the external memory device 123 solely, or a case of including both. The program may be provided to the computer by using a communication means such as the Internet or a dedicated line without using the external memory device 123.

(2) Substrate Processing Process (Semiconductor Device Manufacturing Process)

An example of a substrate processing sequence of forming a metal oxide film on a wafer 200, i.e., a film-forming sequence, as a process of manufacturing a semiconductor device by using the above-described substrate processing apparatus 10 will be described with reference to FIGS. 14 and 15. In the following description, operations of the respective parts constituting the substrate processing apparatus 10 is controlled by the controller 121.

Figure 14:
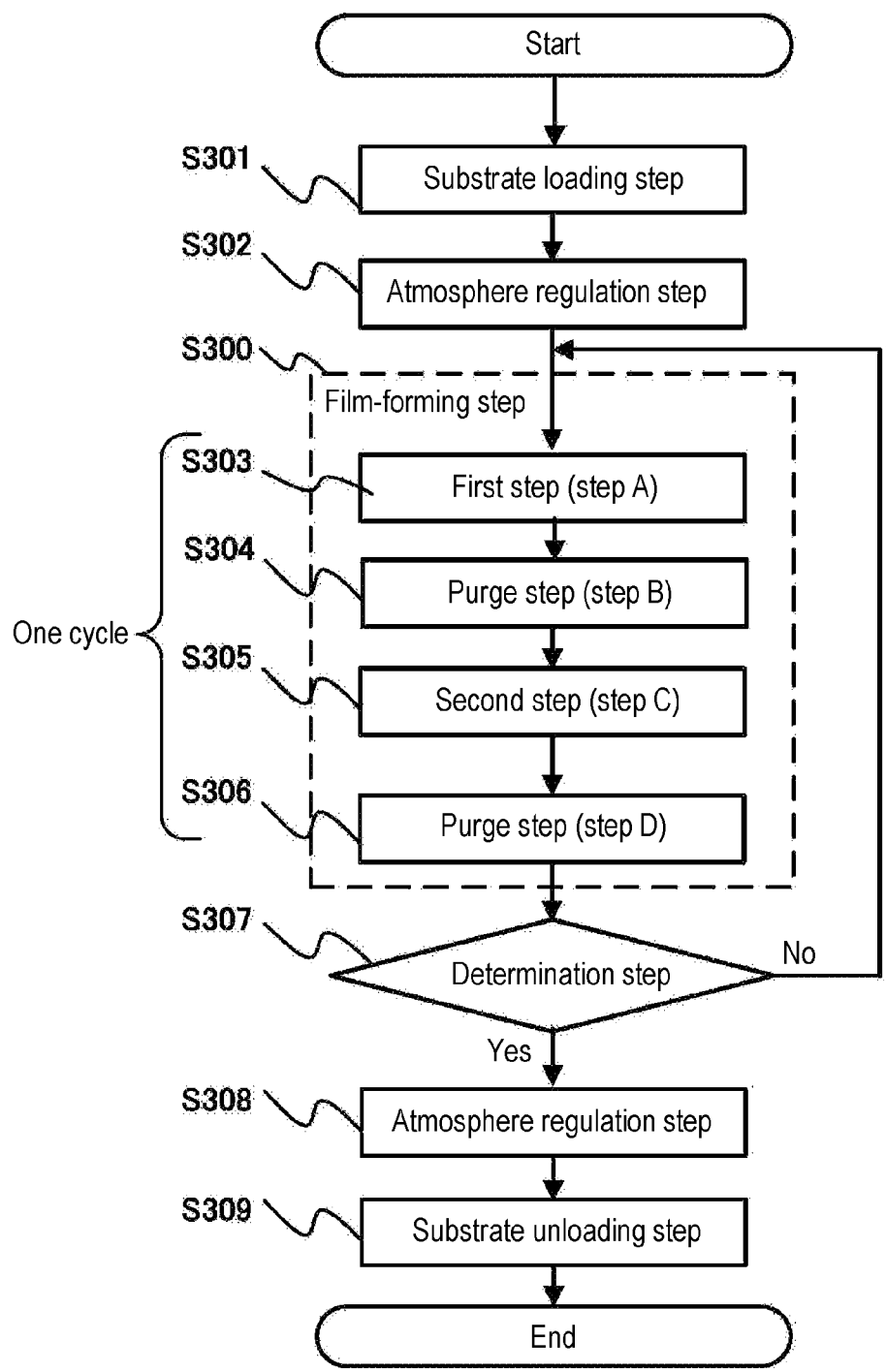
FIG. 14 is an example of a flowchart showing an operation of a substrate processing apparatus used in embodiments of the present disclosure.
Figure 15:
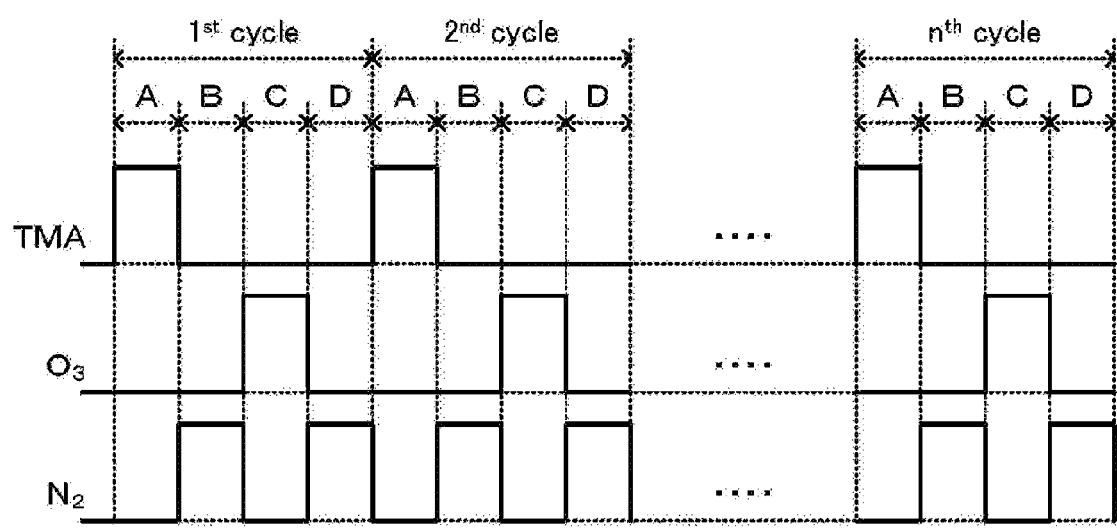
FIG. 15 is a diagram showing an example of a film-forming sequence according to embodiments of the present disclosure.

A film-forming process (film-forming sequence) shown in FIGS. 14 and 15 includes forming a film containing Al and O (an aluminum oxide film or an AlO film) as a metal oxide film on the wafer 200 by performing a cycle a predetermined number of times (n times where n is an integer of 1 or more), the cycle including non-simultaneously performing:

a step (step A) of supplying a TMA gas as a precursor gas to the wafer 200 in the process chamber 201; and a step (step C) of supplying an $O_3$ gas as a reaction gas to the wafer 200 in the process chamber 201.

When the term "wafer" is used herein, it may refer to "a wafer itself" or "a laminated body of a wafer and a predetermined layer or film formed on the surface of the wafer." When the term "wafer surface" is used herein, it may refer to "a surface of a wafer itself" or "a surface of a predetermined layer and the like formed on a wafer." In the present disclosure, when an expression of "a predetermined layer is formed on a wafer," it may mean that a predetermined layer is directly formed on a surface of the wafer itself or may mean that a predetermined layer is formed a layer and the like formed on the wafer. In addition, when the term "substrate" is used herein, it may be synonymous with the term "wafer."

(Substrate Loading Step S301)

When a plurality of wafers 200 are charged into the boat 217 (wafer charging), as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b. In this state, as shown in FIG. 4A, the bottom surface (end) of the flange portion 500a and the upper surface of the heat insulating cylinder 218a are close to each other, such that a gas flow path 501 having a small conductance is formed by a space between the bottom surface of the flange portion 500a and the upper surface of the heat insulating cylinder 218a.

(Atmosphere Regulation Step S302)

The inside of the process chamber 201, i.e., the space where the wafer 200 exists, is vacuum-exhausted (depressurization-exhausted) by the vacuum pump 246 to have a desired pressure (degree of vacuum). In this operation, the pressure in the process chamber 201 is measured by the pressure sensor 245, and the APC valve 243 is feedback-controlled based on the pressure information thus measured (pressure regulation). Furthermore, the wafer 200 in the process chamber 201 is heated by the heater 207 to reach a desired processing temperature. At this time, a state of supplying power to the heater 207 is feedback-controlled based on the temperature information detected by the temperature sensor 263 such that the inside of the process chamber 201 has a desired temperature distribution (temperature regulation). Further, the rotation mechanism 267 starts rotating the boat 217 and the wafer 200. The exhaust of the inside of the process chamber 201 and the heating and rotation of the wafer 200 are all continuously performed at least until the processing of the wafer 200 is completed. In this operation, the valve 354 may be opened to allow a $N_2$ gas to flow into the gas supply pipe 350. The flow rate of the $N_2$ gas is regulated by the MFC 352. The $N_2$ gas is supplied to the low temperature region in the process chamber 201 (e.g., the region below the bottom surface of the heat insulating cylinder 218a), and is discharged from the exhaust pipe 231. The flow rate of the $N_2$ gas at this time may be set to, for example, a flow rate in a range of 0.1 to 2 slm, specifically 0.3 to 0.5 slm.

(Film-Forming Step: S300)

Thereafter, the following four steps, i.e., steps A to D, are performed in sequence.

[First Step: S303 (Step A)]

In this step, the TMA gas is supplied to the wafer 200 in the process chamber 201.

Specifically, the valve 314 is opened to allow the TMA gas to flow through the gas supply pipe 310. The flow rate of the TMA gas is regulated by the MFC 312. The TMA gas is supplied from the gas supply holes 410a to the wafer processing region in the process chamber 201. The TMA gas flows through the exhaust passage 206 via the exhaust hole 204a and is exhausted from the exhaust pipe 231. At this time, the TMA gas is supplied to the wafer 200 (TMA gas supply). At this time, the valve 514 may be opened to allow the $N_2$ gas to flow through the gas supply pipe 510. The flow rate of the $N_2$ gas flowing through the gas supply pipe 510 is regulated by the MFC 512. The $N_2$ gas is supplied together with the TMA gas into the process chamber 201, and is discharged from the exhaust pipe 231. At this time, the valve 524 may be opened to allow the $N_2$ gas to flow through the gas supply pipe 520 to prevent the TMA gas from entering the nozzle 420 (to prevent a backflow of the TMA gas). The flow rate of the $N_2$ gas is regulated by the MFC 522. The $N_2$ gas is supplied into the process chamber 201 via the gas supply pipe 320 and the nozzle 420, and is discharged from the exhaust pipe 231.

At this time, the valve 354 is opened to allow the $N_2$ gas to flow through the gas supply pipe 350. The flow rate of the $N_2$ gas is regulated by the MFC 352. The $N_2$ gas is supplied to the low temperature region in the process chamber 201, and is discharged from the exhaust pipe 231.

A processing condition in this step is exemplified as follows:

Processing pressure: 1 to 1000 Pa, specifically 1 to 100 Pa, more specifically 10 to 50 Pa;

TMA gas supply flow rate: 10 to 2000 sccm, specifically 50 to 1000 sccm, more specifically 100 to 500 sccm;

TMA gas supply time: 1 to 60 seconds, specifically 1 to 20 seconds, more specifically 2 to 15 seconds; and $N_2$ gas supply flow rate (for each gas supply pipe): 1 to 30 slm, specifically 1 to 20 slm, more specifically 1 to 10 slm.

Processing temperature: room temperature (25 degrees C.) to 600 degrees C., specifically 90 to 550 degrees C., more specifically 450 to 550 degrees C.

A lower limit value of the processing temperature in this step may be appropriately changed depending on a type of the O-containing gas used in the step C described below.

The notation of a numerical range such as "1 to 1000 Pa" in the present disclosure means that a lower limit value and an upper limit value thereof are included in the range. Therefore, for example, "1 to 1000 Pa" means "1 Pa or more and 1000 Pa or less." The same applies to other numerical ranges.

By setting the processing pressure in this step to 1000 Pa or less or setting the supply flow rate of TMA gas to 2000 sccm or less, it is possible to suitably perform step B described below and to suppress the TMA gas from being autolyzed in the nozzle 410 and deposited on the inner wall of the nozzle 410. By setting the processing pressure in this step to 1 Pa or more or setting the supply flow rate of the TMA gas to 10 sccm or more, it is possible to increase a reaction rate of the TMA gas on the surface of the wafer 200, thereby obtaining a practical film-forming rate.

By supplying the TMA gas to the wafer 200 under the above-described conditions, an Al-containing layer is formed as a first layer on the outermost surface of the wafer 200. The Al-containing layer may contain C and hydrogen (H) in addition to Al. The Al-containing layer is formed by chemical adsorption or physical adsorption of TMA, chemical adsorption of a substance ($Al(CH_x)_y$) obtained by decomposition of a part of TMA, deposition of Al by thermal decomposition of TMA, or the like, on the surface of the wafer 200. The Al-containing layer may be an adsorption layer (physical adsorption layer or chemical adsorption layer) of TMA or a substance obtained by decomposition of a part of TMA, or may be an Al deposition layer (Al layer).

The TMA gas supplied into the process chamber 201 is supplied not only to the wafer 200, but also to the surfaces of the members in the process chamber 201, i.e., the inner wall of the inner tube 204, the surfaces of the nozzles 410 and 420, the surface of the boat 217, the inner wall of the manifold 209, the upper surface of the seal cap 219, the side surface of the rotary shaft 255, the upper surface and the side surface of the heat insulator 218, and the like. As the TMA gas supplied into the process chamber 201 comes into contact with the surfaces of the members in the process chamber 201, the aforementioned Al-containing layer is formed not only on the wafer 200 but also on the surfaces of the members in the process chamber 201. In addition, reaction by-products may be deposited on the surfaces of the members in the process chamber 201. In this way, the by-products, which will be subject to a cleaning process described below, are attached to the surfaces of the members in the process chamber 201.

By forming the gas flow path 501 in the process chamber 201, it is possible to suppress the entry of the TMA gas from the wafer processing region into the low temperature region and the diffusion of the $N_2$ gas from the low temperature region to the wafer processing region. This makes it possible to suppress the adhesion of by-products to the surfaces of the members in the low temperature region. Further, it is possible to suppress the dilution of the TMA gas in the bottom zone and to improve the uniformity of the film-forming process.

Further, by supplying the $N_2$ gas from the gas supply pipe 350 to the low temperature region, it is possible to reliably suppress the entry of the TMA gas into the low temperature region. This makes it possible to reliably suppress the adhesion of by-products to the surfaces of the members in the low temperature region.

After the first layer is formed, the valve 314 is closed to stop the supply of the TMA gas into the process chamber 201. At this time, the APC valve 243 is left opened.

As the precursor gas, in addition to the TMA gas, it may be possible to use an aluminum chloride ($AlCl_3$) gas or the like.

As the inert gas, in addition to the $N_2$ gas, it may be possible to use a rare gas such as an argon (Ar) gas, a helium (He) gas, a neon (Ne) gas, a xenon (Xe) gas or the like. This point is the same in steps B to D and the like described below.

[Purge Step: S304 (Step B)]

After the step A is completed, the APC valve 243 is kept opened, the inside of the process chamber 201 is vacuum-exhausted by the vacuum pump 246, and the TMA gas unreacted or contributed to the formation of the Al-containing layer, which remains in the process chamber 201, is removed from the inside of the process chamber 201 (residual gas removal). At this time, the valves 514 and 524 may be opened to supply the $N_2$ gas from the nozzles 410 and 420 into the process chamber 201. The $N_2$ gas acts as a purge gas. In this step, the $N_2$ gas may be allowed to flow constantly (supplied continuously), or may be supplied intermittently (in a pulse-like manner).

At this time, the gas remaining in the process chamber 201 may not be removed completely, and the inside of the process chamber 201 may not be purged completely. In a case where an amount of the gas remaining in the process chamber 201 is very small, substantially no adverse effect is given in the subsequent steps. The flow rate of the $N_2$ gas supplied into the process chamber 201 may not have to be large. For example, by supplying the $N_2$ gas in an amount equivalent to a volume of the inner tube 204 (process chamber 201), it is possible to perform a purging operation such that substantially no adverse effect is given in the subsequent steps. By not completely purging the inside of the process chamber 201 in this way, it is possible to shorten the purging time and to improve the throughput. In addition, consumption of the $N_2$ gas may be suppressed to a required minimum level.

[Second Step: S305 (Step C)]

After the step B is completed, the $O_3$ gas is supplied to the wafer 200 in the process chamber 201, i.e., the first layer formed on the wafer 200.

Specifically, the valve 324 is opened to allow the $O_3$ gas to flow through the gas supply pipe 320. The flow rate of the $O_3$ gas is regulated by the MFC 322. The $O_3$ gas is supplied from the gas supply holes 420a to the wafer processing region in the process chamber 201, flows through the exhaust passage 206 via the exhaust hole 204a, and is discharged from the exhaust pipe 231. At this time, the $O_3$ gas) is supplied to the wafer 200 (O₃ gas supply). At this time, the valve 524 may be opened to allow the N₂ gas to flow through the gas supply pipe 520. The flow rate of the N₂ gas flowing through the gas supply pipe 520 is regulated by the MFC 522. The N₂ gas is supplied into the process chamber 201 together with the O₃ gas), and is discharged from the exhaust pipe 231. At this time, the valve 514 may be opened to allow the N₂ gas to flow through the gas supply pipe 510 to prevent the entry of the O₃ gas into the nozzle 410. The flow rate of the N₂ gas is regulated by the MFC 512. The N₂ gas is supplied into the process chamber 201 via the gas supply pipe 310 and the nozzle 410, and is discharged from the exhaust pipe 231.

At this time, the valve 354 is opened to allow the N₂ gas to flow through the gas supply pipe 350. The flow rate of the N₂ gas is regulated by the MFC 352. The N₂ gas is supplied to the low temperature region in the process chamber 201, and is discharged from the exhaust pipe 231.

A processing condition in this step is exemplified as follows:

O₃ gas) supply flow rate: 0.01 to 40 slm, specifically 5 to 30 slm, more specifically 20 to 20 slm.

O₃ gas) supply time: 0.01 to 90 seconds, specifically 0.01 to 30 seconds, more specifically 0.1 to 20 seconds Processing pressure: 1 to 1000 Pa, specifically 1 to 100 Pa, more specifically 10 to 50 Pa Other processing conditions are the same as the processing conditions in the step A.

By supplying the O₃ gas to the wafer 200 under the above-described condition, at least a part of the first layer (Al-containing layer) formed on the wafer 200 reacts with the O₃ gas, and at least a part of the first layer is oxidized (modified). By modifying the first layer, a layer containing Al and O, that is, an aluminum oxide layer (AlO layer) as a second layer (metal oxide layer) is formed on the wafer 200. When forming the second layer, impurities such as C and H contained in the first layer constitute a gaseous substance containing at least C or H in the process of modifying the first layer with the O₃ gas. Then, the gaseous substance is discharged from the process chamber 201. Thus, the second layer becomes a layer containing fewer impurities such as C and H than the first layer.

The O₃ gas) supplied into the process chamber 201 is supplied not only to the wafer 200 but also to the surfaces of the members in the process chamber 201. As the O₃ gas supplied into the process chamber 201 comes into contact with the Al-containing layer formed on the surfaces of the members in the process chamber 201, a part of the Al-containing layer is oxidized (modified) into an AlO layer, like the Al-containing layer formed on the wafer 200.

By forming the gas flow path 501 in the process chamber 201, it is possible to suppress the entry of the O₃ gas from the wafer processing region into the low temperature region and the diffusion of the O₃ gas from the low temperature region to the wafer processing region. Thus, even in this step, it is possible to suppress the adhesion of by-products to the surfaces of the members in the low temperature region, suppress the dilution of the O₃ gas in the bottom zone, and improve the uniformity of the film-forming process.

After the second layer is formed, the valve 324 is closed to stop the supply of the O₃ gas into the process chamber 201. At this time, the APC valve 243 is left opened.

As the O-containing gas, in addition to the O₃ gas, it may be possible to use an oxygen (O₂) gas, a water vapor (H₂O gas), a plasma-excited O₂ gas (O₂*), a hydrogen peroxide (H₂O₂) gas, O₂*+H₂*(plasma-excited hydrogen (H₂) gas), and the like.

[Purge Step: S306 (Step D)]

After the step C is completed, the O₃ gas unreacted or contributed to the formation of the AlO layer and the reaction by-products, which remain in the process chamber 201, are removed from the process chamber 201 by the same processing procedure as in the step B. At this time, the gas and the like remaining in the process chamber 201 may not be removed completely, which is the same as in the step B described above.

[Performing a Predetermined Number of Times]

By performing, one or more times (n times), a cycle that includes performing the steps A to D sequentially (non-simultaneously), that is, without synchronization, an AlO film having a desired film thickness and a desired composition may be formed on the wafer 200. The above-described cycle may be performed a plurality of times. That is, a thickness of the second layer formed per cycle may be set to be smaller than a desired film thickness, and the above-described cycle may be performed a plurality of times until a film thickness of the AlO film formed by laminating the second layer reaches the desired film thickness. The film thickness of the AlO film may be set to, for example, 10 to 150 nm, specifically 40 to 100 nm, more specifically 60 to 80 nm. By setting the film thickness of the AlO film to 150 nm or less, it is possible to reduce a surface roughness. By setting the film thickness of the AlO film to 10 nm or more, it is possible to suppress an occurrence of film peeling due to a stress difference between the AlO film and the base film. The number of times the above-described cycle is performed is appropriately selected according to the film thickness of the AlO film finally formed. In the determination step (S307), it is determined whether or not the above-described cycle has been performed a predetermined number of times. In a case where the above-described cycle has been performed the predetermined number of times, "Yes" (Y) is determined and the film-forming step (S300) is completed. In a case where the above-described cycle has not been performed the predetermined number of times, "NO" (N) is determined and the film-forming step (S300) is performed again.

(Atmosphere Regulation Step: S308)

After the film-forming step (S300) is completed, the N₂ gas as a purge gas is supplied into the process chamber 201 from each of the nozzles 410 and 420, and is discharged from the exhaust pipe 231 via the exhaust hole 204a and the exhaust passage 206. Thus, the inside of the process chamber 201 is purged, and the gas, reaction by-products, and the like remaining in the process chamber 201 are removed from the inside of the process chamber 201 (after-purge). Thereafter, the atmosphere in the process chamber 201 is replaced with the inert gas (N₂ gas) (inert gas replacement), and the pressure in the process chamber 201 returns to the atmospheric pressure (return to atmospheric pressure).

(Substrate Unloading Step: S309)

Thereafter, the seal cap 219 is lowered by the boat elevator 115 to open the lower end of the manifold 209. Then, the processed wafers 200 supported by the boat 217 are unloaded from the lower end of the manifold 209 to the outside of the inner tube 204 (reaction tube) (boat unloading). The processed wafers 200 are discharged from the boat 217 after being unloaded to the outside of the inner tube 204 (wafer discharge).

The by-products adhering to the surfaces of the members in the process chamber 201 when performing the above-described film-forming process are removed by a cleaning process performed after the film-forming process. The cleaning process may be performed, for example, by supplying a cleaning gas into the process chamber 201 from at least one selected from the group of the nozzles 410 and 420. In the cleaning process, the temperature of the cleaning process is raised to activate the cleaning gas, whereby the by-products adhering to the surfaces of the members in the process chamber 201 are removed.

(3) Effect of the Embodiments

According to the above-described embodiments, one or more of the following effects may be obtained.

(a) By providing the flange portion 500a and forming the gas flow path 501 having a small conductance, it is possible to suppress the entry of the processing gas (the TMA gas and the $O_3$ gas) from the wafer processing region to the low temperature region in the process chamber 201 during the film-forming process. As a result, it is possible to suppress the adhesion of by-products to the surfaces of the members in the low temperature region.

Since the low temperature region is a region which may not be easily heated by the heater 207, i.e., a region where the temperature may not be easily increased to a sufficiently high temperature, the cleaning gas supplied to the low temperature region may not be easily activated. Further, since the temperature of the low temperature region of the process chamber 201 is different from the temperature of the high temperature region, the by-products adhering to the surfaces of the members in the low temperature region are different in properties from the by-products adhering to the surfaces of the members installed in the region other than the low temperature region of the process chamber 201 (also referred to as "the members in the high temperature region"). As a result, in the cleaning process, the by-products adhering to the surfaces of the members in the low temperature region are less likely to be removed than the by-products adhering to the surfaces of the members in the high temperature region. Therefore, in a case where the cleaning process is completed at the time when the by-products adhering to the surfaces of the members in the high temperature region are removed, the by-products that have not been completely removed may remain on the surfaces of the members in the low temperature region. Further, in a case where an attempt is made to completely remove the by-products adhering to the surfaces of the members in the low temperature region by the cleaning process, the members in the high temperature region may be etched by the cleaning gas. By suppressing the adhesion of by-products to the surfaces of the members in the low temperature region, it is possible to suppress the by-products from remaining on the surfaces of the members in the low temperature region while suppressing the etching of the members in the high temperature region. In addition, it is possible to shorten a cleaning process time and to shorten a downtime of the substrate processing apparatus. As a result, it is possible to improve a manufacturing throughput of a semiconductor manufacturing apparatus and to improve a productivity of a semiconductor device.

Further, by forming the gas flow path 501, it is possible to suppress the $N_2$ gas supplied from the gas supply pipe 350 to the low temperature region from being diffused into the wafer processing region. Thus, it possible to improve the uniformity of the film-forming process.

In this regard, it is conceivable to adopt a method of suppressing the entry of the processing gas into the low temperature region by reducing the aforementioned distance D2 without providing the flange portion 500a. However, in the substrate processing apparatus 10, the distance D2 may have to be 5 mm or more in consideration of design tolerance. Further, from the viewpoint of avoiding contact between the heat insulating cylinder 218a and the inner tube 204 during rotation of the boat 217, the distance D2 may have to be 5 mm or more. That is, it is difficult to make the distance D2 less than 5 mm. Therefore, in this method, it may be difficult to sufficiently suppress the entry of the processing gas into the low temperature region and the diffusion of the inert gas into the wafer processing region.

Further, it is conceivable to adopt a method of suppressing the entry of the processing gas into the low temperature region by supplying the inert gas of a large flow rate from the gas supply pipe 350 to the low temperature region in the process chamber 201 without providing the flange portion 500a. However, in this method, the inert gas of the large flow rate (e.g., a supply amount larger than a supply amount of the processing gas) is supplied from the gas supply pipe 350. Therefore, the amount of the inert gas diffused into the wafer processing region is large. For that reason, a difference between a concentration of the processing gas supplied to the wafers 200 arranged in the bottom zone and a concentration of the processing gas supplied to the wafers 200 arranged in the center zone or the top zone is larger than those in the embodiments of the present disclosure. As a result, the uniformity of the film-forming process may deteriorate.

(b) By making the bottom surface of the flange portion 500a and the upper surface of the heat insulating cylinder 218a parallel to each other, the distance X may be made as small as possible. Thus, it is possible to further reduce the conductance of the gas flow path 501. As a result, it is possible to reliably suppress the entry of the processing gas into the low temperature region and the diffusion of the inert gas into the wafer processing region.

(c) The conductance of the gas flow path 501 may be further reduced by making the distance X shorter than the distance Y, that is, making the distance Y longer than the distance X to secure a sufficient length of the gas flow path 501. Thus, it possible to reliably suppress the entry of the processing gas into the low temperature region and the diffusion of the inert gas into the wafer processing region.

(d) By making the distance X shorter than the distance D2, it is possible to reliably suppress the diffusion of the inert gas into the wafer processing region. Thus, it possible to further improve the uniformity of the film-forming process.

(e) The aforementioned effects may be similarly obtained when a precursor gas other than the TMA gas is used, when a reaction gas other than the $O_3$ gas is used, or when an inert gas other than the $N_2$ gas is used.

(4) Modifications

The present disclosure is not limited to the above-described embodiments, and may be modified as in the following modifications. These modifications may be arbitrarily combined according to the configuration of the substrate processing apparatus 10 and the like.

(First Modification)

Figure 5A:
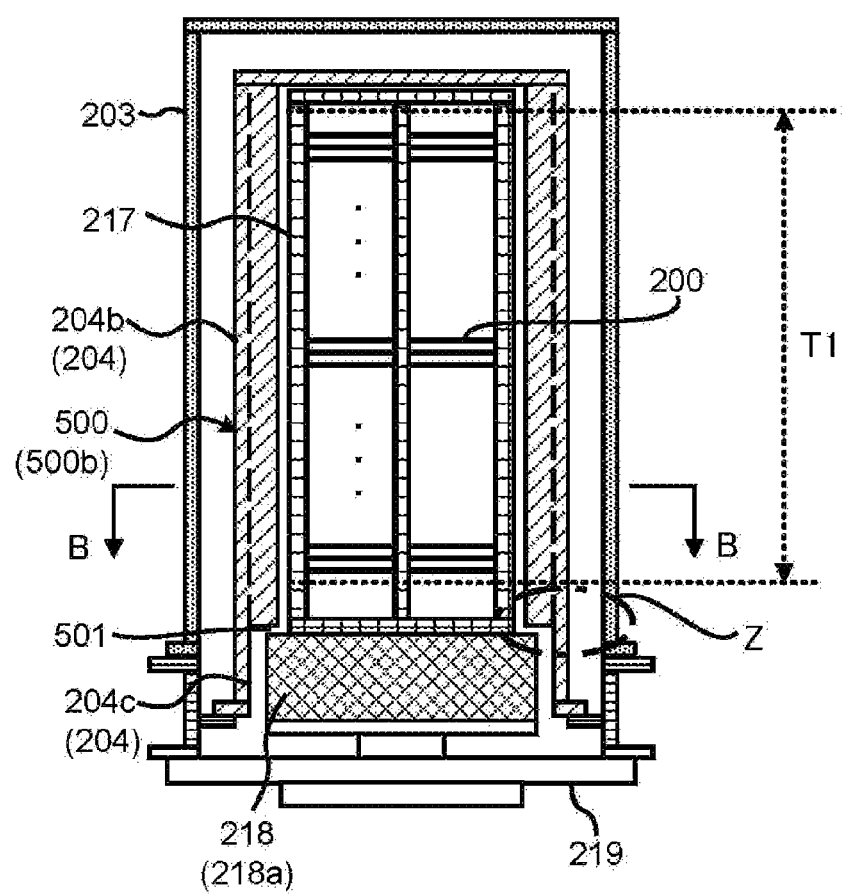
FIG. 5A is a schematic configuration diagram of a modification of a vertical process furnace of a substrate processing apparatus used in embodiments of the present disclosure.
Figure 5B:
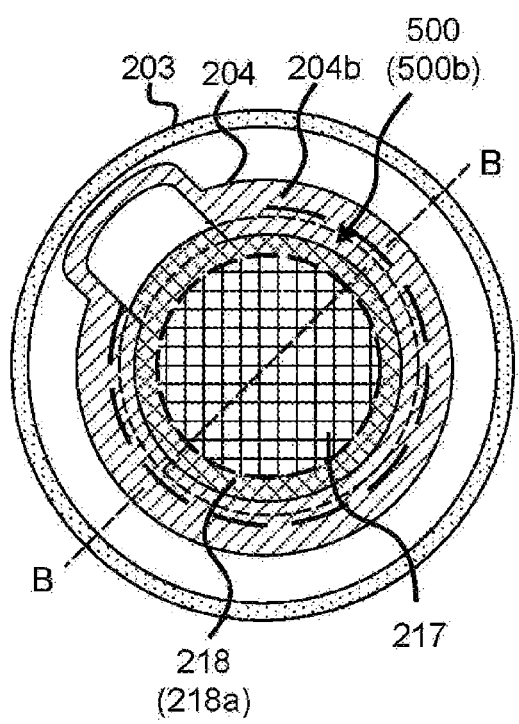
FIG. 5B is a cross-sectional view taken along a line B-B in FIG. 5A.
Figure 7B:
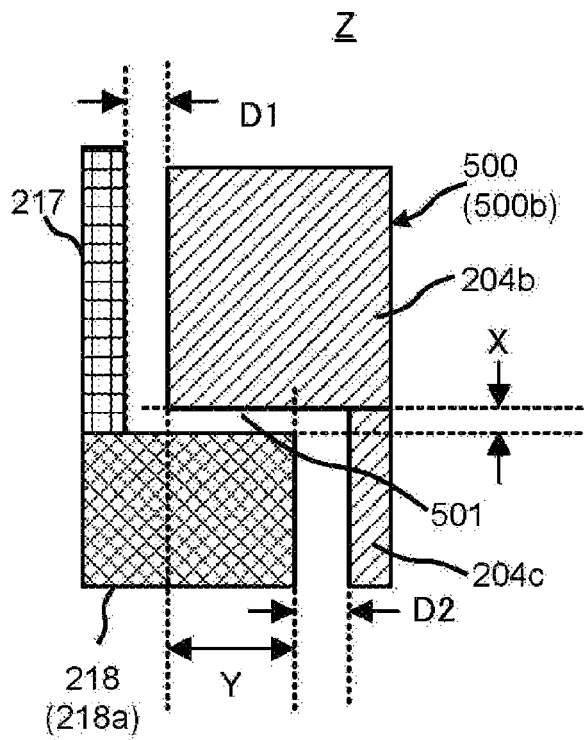
FIG. 7B is an enlarged schematic diagram of region Z indicated by a one-dot chain line in FIG. 5A.

As shown in FIGS. 5A, 5B, and 7B, the thickness of the wall of the inner tube 204 where the protruding portion 500 is located may be set to be larger than the thickness of the wall of the inner tube 204 located below the protruding portion 500. That is, the thickness of the side wall 204b of the inner tube 204 that horizontally surrounds the high temperature region may be set to be larger than the thickness of the side wall 204c of the inner tube 204 that horizontally surrounds the low temperature region. Specifically, the inner tube 204 may be configured such that the side wall 204b overhangs (protrudes) more radially inward than the side wall 204c. In this modification, an overhanging portion 500b as a protruding portion 500 is formed by the side wall 204b. In this modification, a gas flow path 501 is formed by the space between the bottom surface of the overhanging portion 500b (the bottom surface of the side wall 204b) and the upper surface of the heat insulator 218. In this modification as well, the same effects as those of the above-described embodiments may be obtained.

In this modification, the outer wall of the inner tube 204 where the protruding portion 500 is located and the outer wall of the inner tube 204 below the protruding portion 500 are configured to be flush with each other. That is, the outer peripheral side surface of the inner tube 204 including the outer peripheral surface of the side wall 204b and the outer peripheral surface of the side wall 204c is a flush surface (curved surface) having no step. In this modification, the side wall 204b and the side wall 204c have a substantially equal outer diameter. In the present disclosure, the term "substantially equal outer diameter" means that the difference between the outer diameter of the side wall 204b and the outer diameter of the side wall 204c falls within, for example, about ±3% (within a design tolerance). Since the side wall 204b overhangs more radially inward than the side wall 200c, the inner diameter of the side wall 204b is smaller than the inner diameter of the side wall 204c. Such a configuration makes it easy to manufacture the inner tube 204. Further, it is possible to suppress an irregular reflection of radiant heat from the heater 207 at the outer wall of the inner tube 204, and it is possible to improve the temperature uniformity among the wafers 200.

Since the outer peripheral side surface of the inner tube 204 is a flush surface having no step, an exhaust speed (exhaust conductance) of the gas exhausted from the exhaust hole 204a may be kept uniform over a region from the upper portion to the lower portion of the exhaust hole 204a. That is, the exhaust characteristics of the wafer processing region may be made uniform over a region from the upper portion to the lower portion of the boat 217. As a result, the pressure in the process chamber 201 may be made uniform in the film-forming process, and the in-plane film thickness uniformity of the thin film formed on the wafer 200 may be further improved.

Further, in this modification, the outer diameter of the side wall 204b may have to be made larger than the outer diameter of the inner tube 204 of the above-described embodiments to make an internal volume of the process chamber 201 equal to the volume of the process chamber 201 of the above-described embodiments. In this modification, the outer tube 203 has the same configuration as those of the above-described embodiments. Therefore, the volume of the exhaust passage 206 formed in this modification (that is, the volume of the space between the inner tube 204 and the outer tube 203) becomes smaller than those of the above-described embodiments. As a result, in this modification, it is possible to improve a gas replacement efficiency as compared with the above-described embodiments.

Further, in this modification, the side wall 204b is closer to the edge of the wafer 200 than in the above-described embodiments. That is, a distance between the inner surface of the side wall 204b and the edge of the wafer 200 is smaller than the distance between the inner surface of the inner tube 204 and the edge of the wafer 200 in the above-described embodiments. Therefore, the volume of the space between the inner surface of the side wall 204b and the edge of the wafer 200 is smaller than those of the above-described embodiments. Thus, the amount of the processing gas diffused into the space between the inner surface of the side wall 204b and the edge of the wafer 200 is reduced, which makes it possible to supply an increased amount of processing gas to the surface of the wafer 200. As a result, it is possible to further improve the in-plane film thickness uniformity of the thin film formed on the wafer 200.

The inner tube 204 of this modification is a cylindrical member having an upper end t closed and a lower end opened. The inner tube 204 of this modification may be manufactured by providing a member having a side wall thickness equal to the thickness of the side wall 204b and cutting the side wall of the member that horizontally surrounds the low temperature region (the side wall of the portion to be the side wall 204c), radially outward from the inner peripheral surface. In this way, the inner tube 204 of this modification may be easily manufactured by the cutting operation solely. As a result, a dimensional error in manufacturing may be suppressed to fall within a range of ±1% or less. That is, the inner tube 204 of this modification may be manufactured with high accuracy. When the inner tube 204 of this modification is manufactured by the cutting operation, the side wall 204b, the side wall 204c, and the ceiling portion may be integrally formed by the same member.

The inner tube 204 of this modification may also be manufactured by welding a first member constituting the side wall 204b, a second member constituting the side wall 204c, and a third member constituting the ceiling portion. Each of the first member and the second member is a cylindrical member having upper and lower ends opened. The first member and the second member have a substantially equal outer diameter. The first member has an inner diameter smaller than the inner diameter of the second member. When the inner tube 204 of this modification is manufactured by a welding operation, for example, even when the first member and the second member are respectively designed such that the outer diameter of the side wall 204b and the outer diameter of the side wall 204c become equal to each other, a difference of about ±3% may be generated between the outer diameter of the side wall 204b and the outer diameter of the side wall 204c depending on a manufacturing accuracy.

(Second Modification)

Figure 6A:
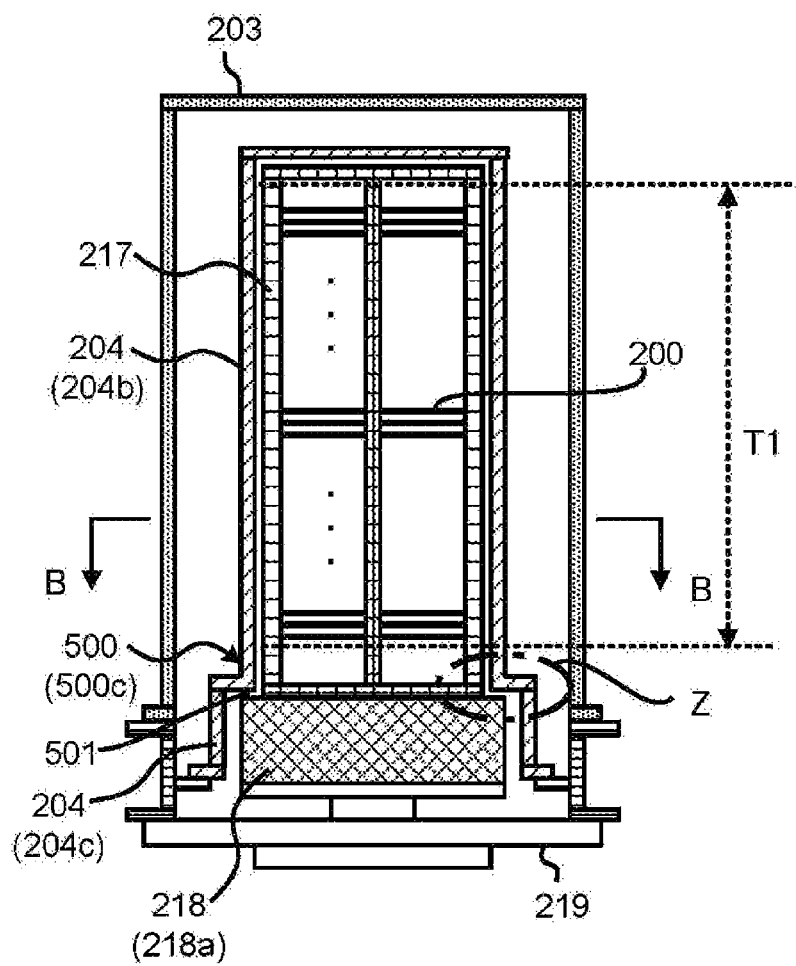
FIG. 6A is a schematic configuration diagram of another modification of a vertical process furnace of a substrate processing apparatus used in embodiments of the present disclosure.
Figure 6B:
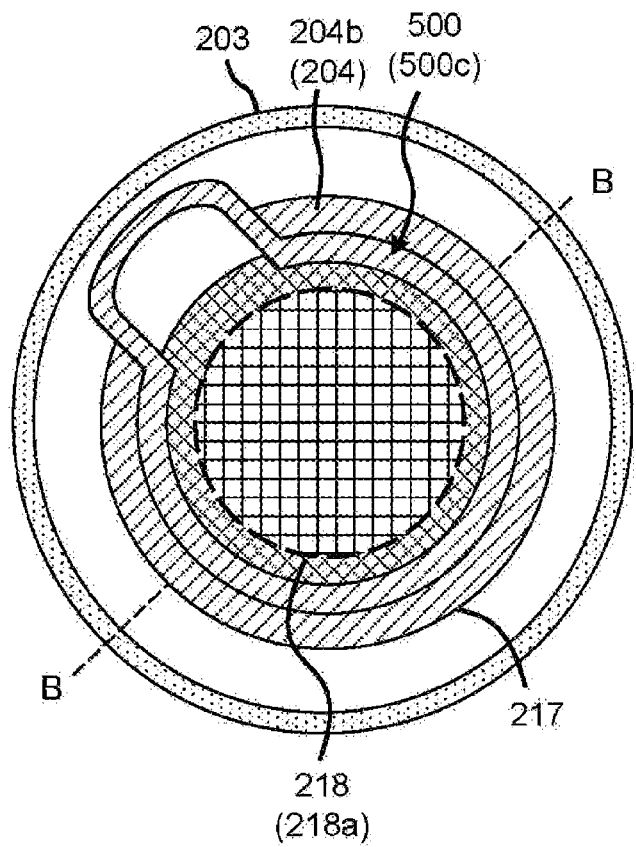
FIG. 6B is a sectional view taken along line B-B in FIG. 6A.
Figure 7C:
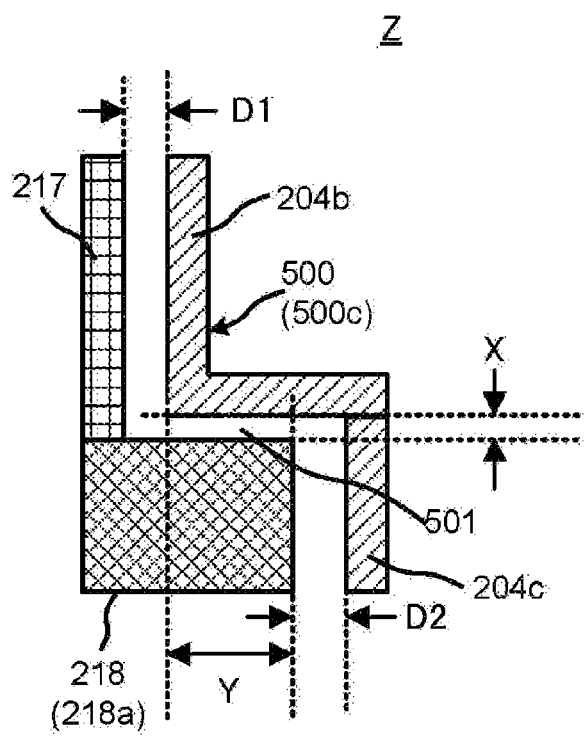
FIG. 7C is an enlarged schematic diagram of region Z indicated by a one-dot chain line in FIG. 6A.

As shown in FIGS. 6A, 6B and 7C, the side wall 204b may be configured to include a vertical portion and a horizontal portion extending to protrude radially outward from the lower end of the vertical portion, and an overhanging portion 500c as the protruding portion 500 may be formed by the side wall 204b. In this modification, the bottom surface of the horizontal portion of the side wall 204b and the upper end of the side wall 204c are in contact with each other. Further, the vertical portion and the horizontal portion of the side wall 204b and the side wall 204c have a substantially equal thickness. Further, the outer diameter of the vertical portion of the side wall 204b is smaller than the outer diameter of the side wall 204c, and the outer diameter of the horizontal portion of the side wall 204b is equal to the outer diameter of the side wall 204c. In this modification, a gas flow path 501 is formed by the bottom surface of the overhanging portion 500c (that is, the bottom surface of the horizontal portion of the side wall 204b) and the upper surface of the heat insulating cylinder 218a.

The same effects as those of the above-described embodiments and modification may be obtained by this modification. Further, in this modification, as in the first modification described above, the vertical portion of the side wall 204b is close to the edge of the wafer 200. Thus, in this modification as well, it is possible to obtain the same effect as that obtained in the first modification by the vertical portion of the side wall 204b located closer to the edge of the wafer 200.

(Third Modification)

Figure 9A:
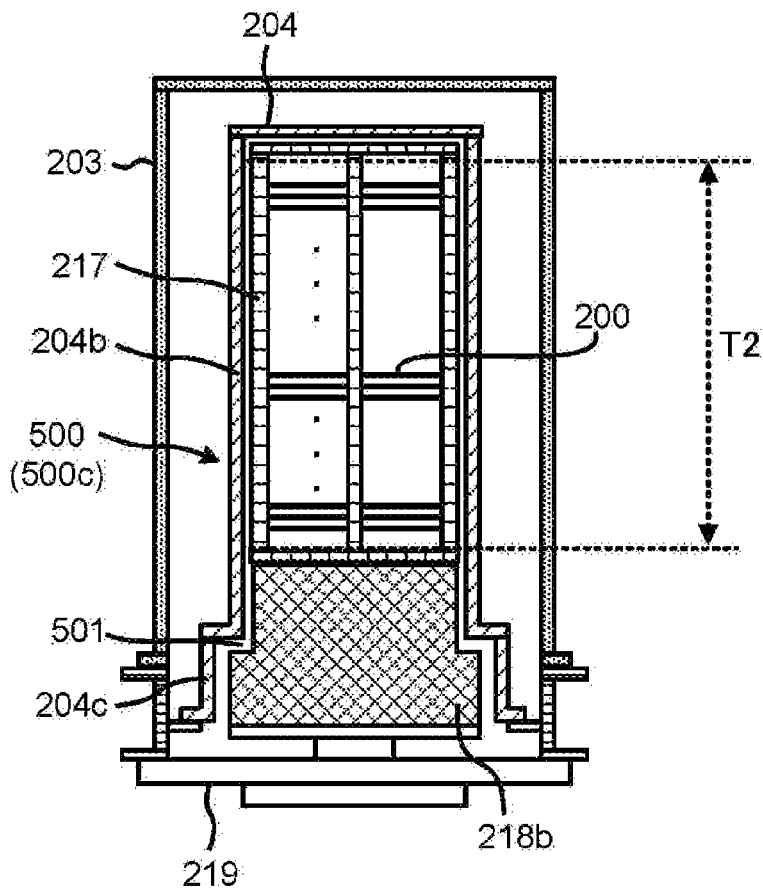
FIG. 9A is a schematic configuration diagram of another modification of a vertical process furnace of a substrate processing apparatus used in embodiments of the present disclosure.

As shown in FIG. 9A, a heat insulating cylinder 218b having a convex shape with respect to the boat 217 may be provided. That is, as the heat insulator 218, there may be provided a heat insulating cylinder 218b having a two-stage configuration that includes an upper stage portion having an outer diameter substantially equal to the outer diameter of the boat 217 and a lower stage portion having an outer diameter larger than the outer diameter of the upper stage portion. In this modification, the protruding portion 500 (the flange portion 500a, or overhanging portion 500b or 500c) is provided to faces the exposed upper surface (step portion, hereinafter also referred to as "exposed upper surface") of the lower stage portion of the heat insulating cylinder 218b. Further, a gas flow path 501 is formed by the space between the bottom surface of the protruding portion 500 and the exposed upper surface of the lower stage portion of the heat insulating cylinder 218b. The same effects as those of the above-described embodiments and modifications may be obtained by this modification.

(Fourth Modification)

As shown in FIG. 9B, a plurality of heat insulating plates 218c may be installed as the heat insulator 218. The heat insulating plates 218c are made of a heat-resistant material such as quartz or SiC. In this modification, the protruding portion 500 is installed to face the upper surface of the heat insulating plate 218c arranged at the uppermost stage. In this modification, the gas flow path 501 is formed by the space between the bottom surface of the protruding portion 500 and the upper surface of the heat insulating plate 218c arranged at the uppermost stage. The same effects as those of the above-described embodiments may be obtained by this modification.

(Fifth and Sixth Modifications)

Figure 8A:
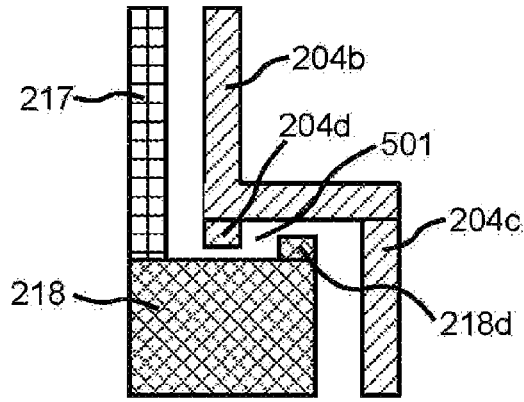
FIG. 8A is a diagram showing a modification of the gas flow path.
Figure 8B:
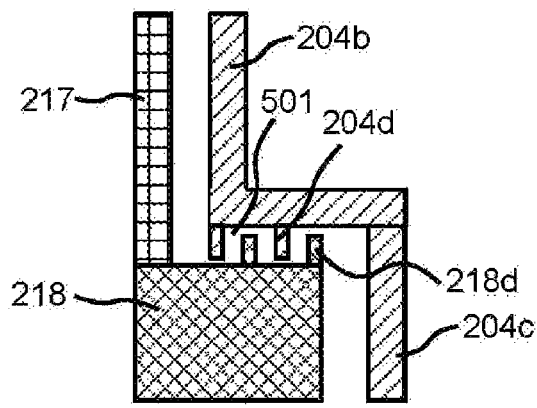
FIG. 8B is a diagram showing another modification of the gas flow path.

In fifth and sixth modifications as illustrated in FIGS. 8A and 8B, a labyrinth structure is provided at the gas flow path 501. Specifically, convex portions 204d protruding from the bottom surface of the protruding portion 500 toward the gas flow path 501 and convex portions 218d protruding from the upper surface of the heat insulator 218 toward the gas flow path 501 are provided alternately such that the convex portions 204d and the convex portions 218d do not make contact with each other. That is, the convex portions 204d and 218d are alternately provided such that they do not overlap each other in a plane view. The heights of the convex portions 204d and 218d are set to heights at which the convex portions 204d and 218d do not block the gas flow path 501, that is, heights less than the distance X. The number of convex portions 204d and 218d provided at the gas flow path 501 is not particularly limited.

The same effects as those of the above-described embodiments and modifications may be obtained by these modifications. Further, according to these modifications, it is possible to further reduce the conductance of the gas flow path 501, and to more reliably suppress the entry of the processing gas into the low temperature region and the diffusion of the inert gas into the wafer processing region.

(Seventh and Eighth Modifications)

Figure 8C:
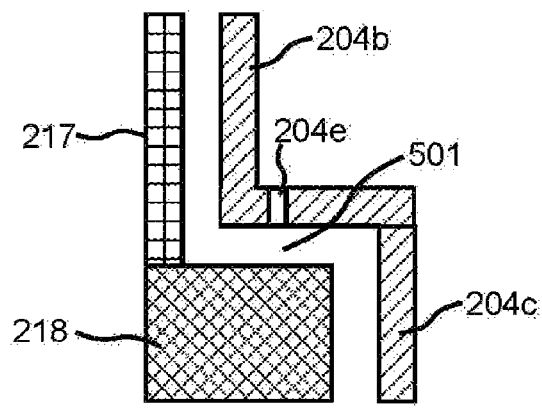
FIG. 8C is a diagram showing another modification of the gas flow path.
Figure 8D:
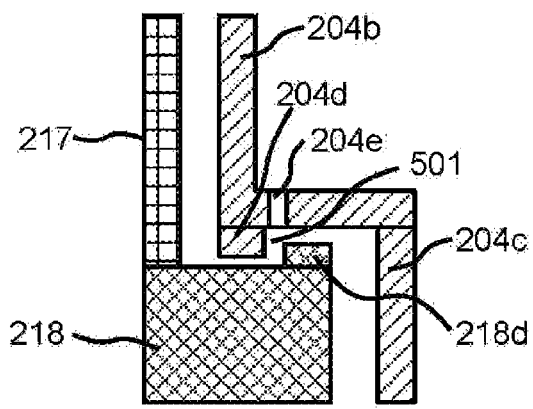
FIG. 8D is a diagram showing another modification of the gas flow path.

In seventh and eighth modifications, as illustrated in FIGS. 8C and 8D, a gas vent hole 204e configured to bring the gas flow path 501 and the exhaust passage 206 into fluid communication with each other is provided at the protruding portion 500. The gas vent hole 204e is formed as, for example, a slit-shaped through-hole. The gas vent hole 204e may include a plurality of holes.

The same effects as those of the above-described embodiments and modifications may be obtained by these modifications. Further, according to these modifications, the gas in the gas flow path 501 may be discharged to the exhaust passage 206 via the gas vent hole 204e. Thus, it possible to suppress the entry of the processing gas into the region near the furnace opening where the temperature is particularly low in the low temperature region. As a result, it is possible to reliably prevent by-products from adhering to the surfaces of the members installed at the region near the furnace opening, for example, the upper surface of the seal cap 219 and the side surface of the rotary shaft 255. Further, it is possible to increase the supply amount of the inert gas supplied from the second inert gas supply system. Thus, it possible to reliably suppress the entry of the processing gas into the region near the furnace opening. As a result, it is possible to reliably prevent by-products from adhering to the surfaces of the members installed at the region near the furnace opening. Further, even when the amount of the inert gas supplied into the low temperature region is increased, it is possible to suppress the diffusion of the inert gas from the low temperature region to the wafer processing region.

(Ninth Modification)

Figure 8E:
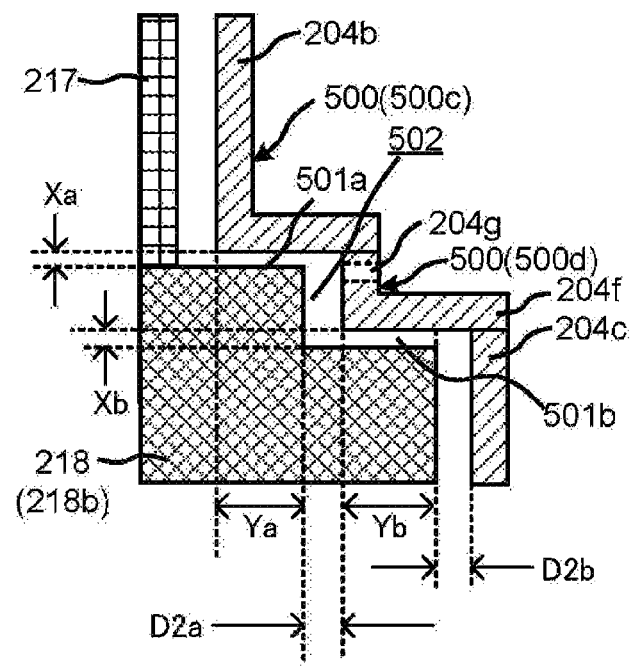
FIG. 8E is a diagram showing another modification of the gas flow path.

In ninth modification, as illustrated in FIG. 8E, a gas flow path 501 is formed in a step-like shape, for example, and includes a plurality of gas flow paths having a small conductance. In this modification, for example, two gas flow paths 501a and 501b are formed. Specifically, in this modification, there is provided a heat insulating cylinder 218b having a two-stage configuration in which the outer diameter of the upper stage portion is larger than the outer diameter of the boat 217. Further, as in the second modification, the side wall 204b is configured to include a vertical portion and a horizontal portion, and an overhanging portion 500c (first protruding portion) as a protruding portion 500 is formed by the side wall 204b. Further, a side wall 204f including a vertical portion and a horizontal portion extending radially outward of the inner tube 204 from the lower end of the vertical portion is provided between the side wall 204b and the side wall 204c. An overhanging portion 500d (second protruding portion) as a protruding portion 500 is formed by the side wall 204f. The outer diameter of the vertical portion of the side wall 204f is equal to the outer diameter of the horizontal portion of the side wall 204b, and the outer diameter of the horizontal portion of the side wall 204f is equal to the outer diameter of the side wall 204c. In this modification, a gas flow path 501a is formed by the space between the bottom surface of the overhanging portion 500c (the bottom surface of the horizontal portion of the side wall 204b) and the outer peripheral portion of the upper surface of the upper stage portion of the heat insulating cylinder 218b. A gas flow path 501b is formed by the space between the bottom surface of the overhanging portion 500d (the bottom surface of the horizontal portion of the side wall 204f) and the exposed upper surface of the lower stage portion of the heat insulating cylinder 218b.

The distance Xa between the bottom surface of the overhanging portion 500c and the upper surface of the upper stage portion of the heat insulating cylinder 218b and the distance Xb between the bottom surface of the overhanging portion 500d and the upper surface of the lower stage portion of the heat insulating cylinder 218b may be respectively set to fall within the same range as the distance X described above. The distance Ya between the inner surface of the overhanging portion 500c (the inner surface of the vertical portion of the side wall 204b) and the side surface of the upper stage portion of the heat insulating cylinder 218b and the distance Yb between the inner surface of the overhanging portion 500d (the inner surface of the vertical portion of the side wall 204f) and the side surface of the lower stage portion of the heat insulating cylinder 218b may be respectively set to fall within the same range as the distance Y described above. The distance D2a between the side surface of the upper stage portion of the heat insulating cylinder 218b and the vertical portion of the side wall 204f and the distance D2b between the side surface of the lower stage portion of the heat insulating cylinder 218b and the side wall 204c may be respectively set to fall within the same range as the distance D2 described above. In this modification, as in the embodiments described above, the distance Xa may be shorter than the distance Ya (distance Xa<distance Ya), the distance Xb may be shorter than the distance Yb (distance Xb<distance Yb), the distance Xa may be shorter than the distance D2a (distance Xa<distance D2a), and the distance Xb may be shorter than the distance D2b (distance Xb<distance D2b). The distance Xa and the distance Xb may be the same or different, the distance Ya and the distance Yb may be the same or different, and the distance D2a and the distance D2b may be the same or different.

The same effects as those of the above-described embodiments and modifications may be obtained by this modification. Further, according to this modification, since a plurality of gas flow paths is provided, it is possible to more reliably suppress the entry of the processing gas into the low temperature region. In addition, two or more gas flow paths having a small conductance may be provided.

Further, in this modification, a gas vent hole 204g that brings the space 502 formed by the side surface of the upper stage portion of the heat insulating cylinder 218b and the vertical portion of the side wall 204f into fluid communication with the exhaust passage 206 may be provided at the vertical portion of the side wall 204f. Thus, it possible to exhaust the inside of the space 502 and to reduce the amount of the gas flowing into the gas flow path 501b. That is, it is possible to reliably suppress the entry of the processing gas into the region near the furnace opening. As a result, it is possible to reliably suppress the adhesion of by-products to the surfaces of the members provided at the region near the furnace opening. In this modification, the side wall 204c may be provided with a gas vent hole 204g. Even in this case, the same effects may be obtained.

(Tenth Modification)

Figure 8F:
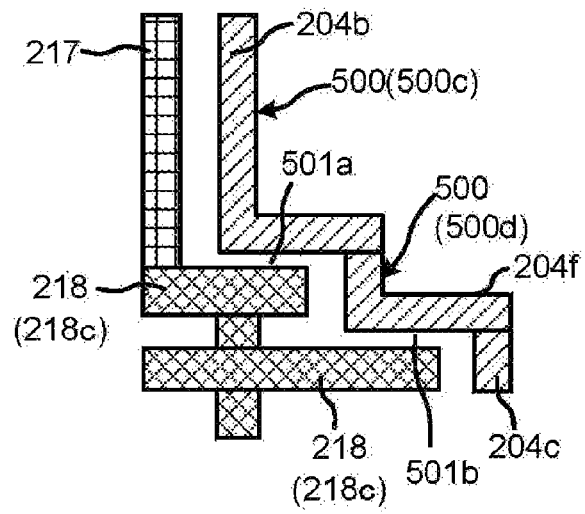
FIG. 8F is a diagram showing another modification of the gas flow path.

In tenth modification, as shown in FIG. 8F, a plurality of gas flow paths having a small conductance are formed. In this modification, a plurality of heat insulating plates 218c are provided as the heat insulator 218. The heat insulating plate 218c arranged at the uppermost stage has a diameter larger than the outer diameter of the boat 217 and smaller than the diameter of the other heat insulating plates 218c. In this modification, a gas flow path 501a is formed by the space between the bottom surface of the overhanging portion 500c and the outer peripheral portion of the upper surface of the heat insulating plate 218c arranged at the uppermost stage. Further, a gas flow path 501b is formed by the space between the bottom surface of the overhanging portion 500d and the outer peripheral portion of the upper surface of the heat insulating plate 218c arranged in the second stage from the top. Other configurations may be the same as those of the ninth modification described above. The same effects as those of the above-described embodiments and the ninth modification may be obtained by this modification.

(Eleventh Modification)

The spare chamber 201a may be in fluid communicate with the process chamber 201 via a partition wall 204h where a plurality of gas supply slits (gas supply holes) 400a are provided from the upper portion to the lower portion thereof. In this modification, as shown in FIG. 10, a first protruding portion provided at the inner circumference of the inner tube 204 and a second protruding portion provided at the opening 201b that brings the process chamber 201 and the spare chamber 201a into fluid communication with each other may be formed as the protruding portion 500. Specifically, a side wall 204b including a vertical portion and a horizontal portion similar to those of the second modification may be provided, and the arrangement position of the partition wall 204h may be regulated such that an overhanging portion 500c (first protruding portion) as the protruding portion 500 may be formed by the side wall 204b and an overhanging portion 500f (second protruding portion) as the protruding portion 500 may be formed by the partition wall 204h and the horizontal portion of the side wall 204b. In this modification, the gas injected from the gas supply holes 410a and 420a into the spare chamber 201a is injected into the process chamber 201 from each of the gas supply slits 400a. The same effects as those of the above-described embodiments and modifications may be obtained by this modification. Further, in this modification, it is possible to suppress the entry of the processing gas in the spare chamber 201a into the low temperature region of the process chamber 201.

(Twelfth Modification)

Figure 11:
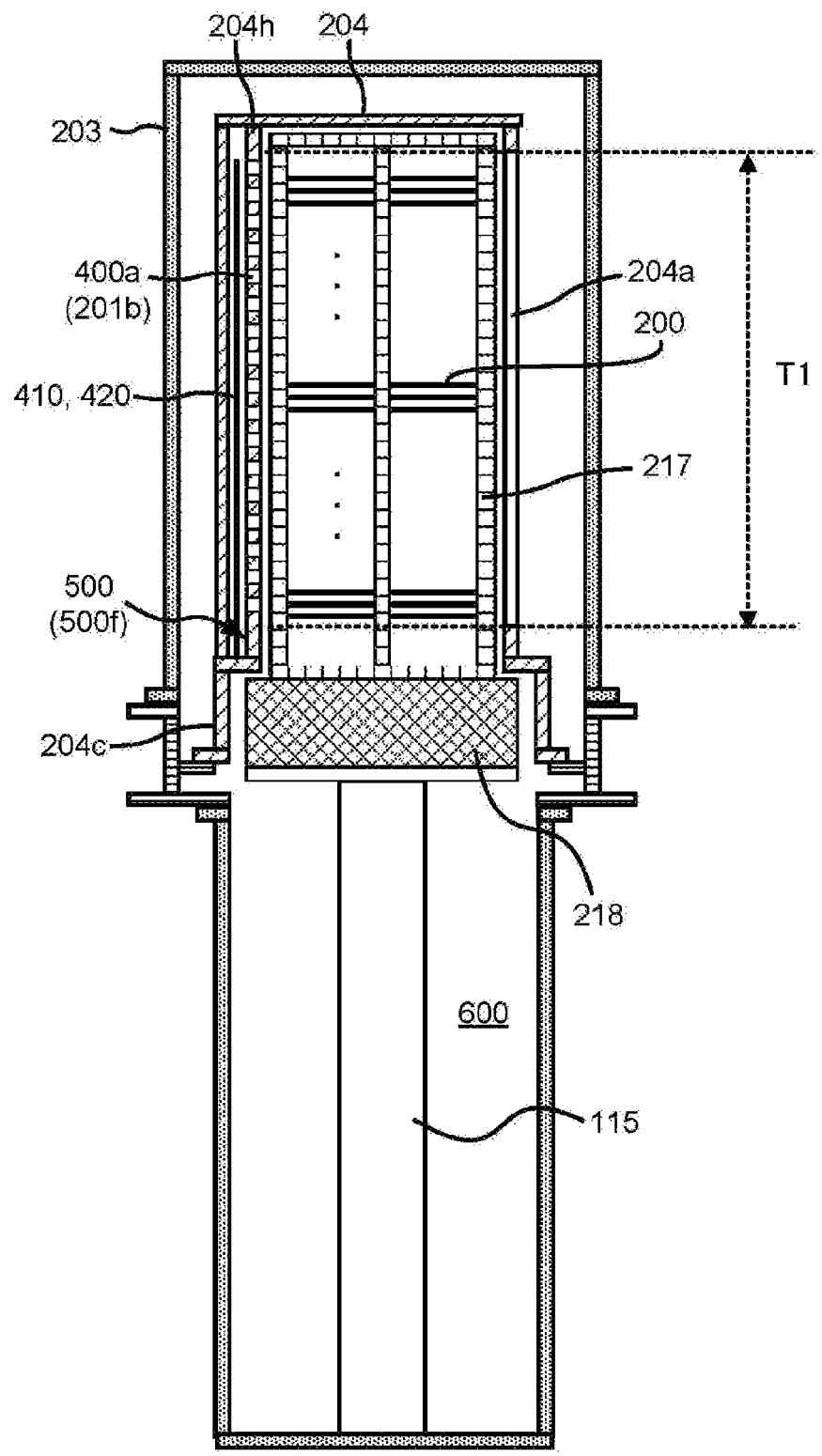
FIG. 11 is a schematic configuration diagram of another modification of a vertical process furnace of a substrate processing apparatus used in embodiments of the present disclosure.

As shown in FIG. 11, the process chamber 201 and the transfer chamber 600 may be in fluid communication with each other without providing the seal cap 219. Also in this modification, the same effects as those of the above-described embodiments and modifications may be obtained. That is, by providing the protruding portion 500, it is possible to suppress the entry of the processing gas into the low temperature region of the process chamber 201 and the transfer chamber 600, and it is possible to suppress the adhesion of by-products to the surfaces of the members in the low temperature region and the inside of the transfer chamber 600. Further, in this modification, the position of the boat 217 in the height direction may be easily regulated during the processing of the wafer 200. Moreover, in this modification, it is possible to suppress generation of particles. This modification is not limited to the case shown in FIG. 11, and may be suitably applied to any of the embodiments and the first to eleventh modifications described above.

(Thirteenth Modification)

Figure 12:
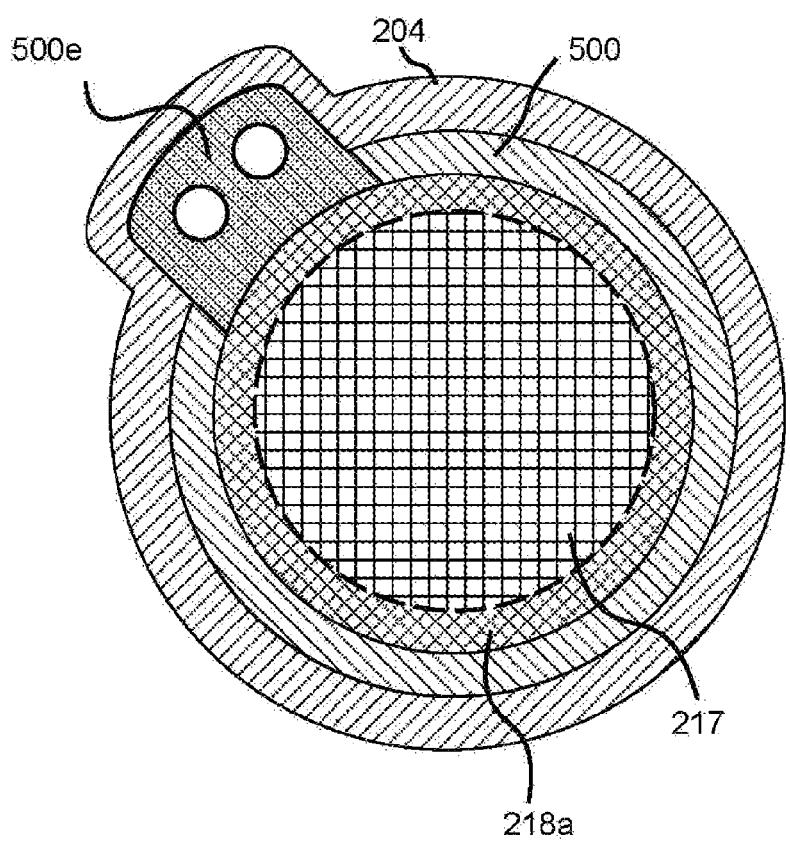
FIG. 12 is a schematic configuration diagram of another modification of a vertical process furnace of a substrate processing apparatus used in embodiments of the present disclosure, in which the process furnace portion is shown in a horizontal cross-sectional view.

The protruding portion 500 may include a plurality of different members. For example, as shown in FIG. 12, the protruding portion 500 may be formed by the flange portion 500a (first protruding portion) of the above-described embodiments and the overhanging portion 500e (second protruding portion) formed by a nozzle cover. The nozzle cover is installed to cover the nozzles 410 and 420 and close the opening 201b. The same effects as those of the above-described embodiments and modifications may be obtained by this modification.

(Fourteenth Modification)

When the substrate processing is performed without rotating the boat 217, the distance X in the atmospheric pressure atmosphere may be set to 0 (zero). That is, in the atmospheric pressure atmosphere, the bottom surface of the protruding portion 500 and the upper surface (exposed upper surface) of the heat insulator 218 may be brought into contact with each other. Even in a case where the bottom surface of the protruding portion 500 and the upper surface of the heat insulator 218 are in contact with each other in the atmospheric pressure atmosphere, a minute gap is generated between them in a depressurized atmosphere, thereby forming a gas flow path 501. In this modification as well, the same effects as those of the above-described embodiments may be obtained.

(Fifteenth Modification)

In addition to the nozzles 410 and 420, a third nozzle and a fourth nozzle (not shown) may be accommodated in the spare chamber 201*a*. The third nozzle and the fourth nozzle may have the same configuration as the nozzles 410 and 420, respectively. For example, the gas supply pipes 330 and 340 indicated by the broken lines in FIG. 3 are connected to the third nozzle and the fourth nozzle. At the gas supply pipes 330 and 340, MFCs 332 and 342 and valves 334 and 344 are sequentially installed from the corresponding upstream sides of the gas flow respectively. From the gas supply pipe 330, for example, a cleaning gas may be supplied into the process chamber 201 via the MFC 332, the valve 334 and the third nozzle. From the gas supply pipe 340, for example, an inert gas may be supplied into the process chamber 201 via the MFC 342, the valve 344 and the fourth nozzle.

(Sixteenth Modification)

As indicated by the dotted line in FIG. 3, a flash tank (gas reservoir) 321 may be installed between the MFC 322 and the valve 324 of the gas supply pipe 320, and the high-pressure $O_3$ gas stored in the flash tank 321 may be supplied into the process chamber 201 at once. In this case, the $O_3$ gas is stored in the flash tank 321 with the valve 324 closed. Then, when a predetermined amount of $O_3$ gas having a predetermined pressure is stored in the flash tank 321, the valve 324 is opened. Thus, the high-pressure $O_3$ gas stored in the flash tank 321 is supplied into the process chamber 201 at once (in a pulsed manner).

The same effects as those of the above-described embodiments may be obtained by this modification. Further, by supplying the $O_3$ gas into the process chamber 201 at once, a flow velocity of the $O_3$ gas supplied into the process chamber 201 is increased, and the $O_3$ gas is efficiently supplied to the central portion of the wafer 200. Thus, it is possible to improve the in-plane film thickness uniformity and film quality uniformity of the wafer 200.

(Seventeenth Modification)

The inert gas may not be supplied into the low temperature region from the second inert gas supply part. Even in this case, by providing the protruding portion 500, it is possible to suppress the entry of the processing gas from the wafer processing region into the low temperature region.

(Eighteenth Modification)

The present disclosure is not limited to the case where the wafer arrangement region (wafer processing region) is the uniform heating region T1. The uniform heating region T1 may be a region including the wafer processing region. That is, the length of the wafer processing region in the wafer arrangement direction may be equal to or less than the length of the uniform heating region T1 in the wafer arrangement direction.

Other Embodiments of the Present Disclosure

Although the embodiments of the present disclosure have been specifically described above, the present disclosure is not limited to the above-mentioned embodiments, and various changes may be made without departing from the spirit of the preset disclosure.

In the above-described embodiments, there have been described the examples in which the reaction tube includes the outer tube 203 and the inner tube 204. However, the present disclosure is not limited thereto. For example, the reaction tube may be configured to include the outer tube 203 without including the inner tube 204. In this case, the protruding portion 500 may be provided at the outer tube 203 below the wafer arrangement region. In the embodiments, the exhaust pipe 231 may be connected to the outer tube 203 that horizontally surrounds the region above the low temperature region, that is, the high temperature region. Further, in the embodiments, the gas vent hole 204*e* is configured such that the gas may be discharged from the gas flow path 501 to the exhaust pipe 231. Also in these embodiments, the same effects as those of the above-described embodiments and modifications may be obtained.

In the above-described embodiments, there have been described the examples in which the precursor gas and the reaction gas are supplied alternately and non-simultaneously. However, the present disclosure is not limited thereto. For example, the precursor gas and the reaction gas may be supplied at the same time. In this case, the film-forming rate may be significantly increased, and a film-forming process time may be shortened. Thus, it becomes possible to improve the manufacturing throughput of the semiconductor manufacturing apparatus. Further, in this case, although the processing gas is likely to enter the low temperature region, it is possible to suppress the entry of the processing gas into the low temperature region by providing the protruding portion 500 as described above. Thus, it possible to reduce the amount of by-products adhering to the surfaces of the members in the low temperature region. As a result, it is possible to shorten a cleaning process time, and to shorten the downtime of the substrate processing apparatus.

Further, in the above-described embodiments, there have been described the examples in which the film containing Al as a main element on is formed on the wafer. However, the present disclosure is not limited to such embodiments. That is, the present disclosure may be suitably applied to a case where a film containing, as a main element, not only Al but also a metal element such as titanium (Ti), zirconium (Zr), hafnium (Hf), tantalum (Ta), niobium (Nb), molybdenum (Mo), tungsten (W), yttrium (Y), lanthanum (La), strontium (Sr) or the like, or a semi-metal element (semiconductor element) such as silicon (Si) or the like is formed on a substrate. That is, the above-described substrate processing apparatus may be suitably applied to a case where a nitride film, a carbonitride film, an oxide film, an oxycarbide film, an oxynitride film, an oxycarbonitride film, a boronitride film, or a borocarbonitride film, a film composed of a metal element, or the like, which contains the aforementioned metal element or semi-metal element, is formed on a wafer.

For example, in step A, as the precursor gas, in addition to the Al-containing gas such as the TMA gas or the like, it may be possible to use a Si-containing gas, a Ti-containing gas, a Ta-containing gas, a Zr-containing gas, a Hf-containing gas, a W-containing gas, a Nb-containing gas, a Mo-containing gas, a W-containing gas, a Y-containing gas, a La-containing gas, a Sr-containing gas or the like. Moreover, for example, as the reaction gas, in addition to the O-containing gas such as the $O_3$ gas or the like, it may be possible to use a nitrogen (N)-containing gas such as an ammonia ($NH_3$) gas or the like, a hydrogen (H)-containing gas such as a triethylamine (($C_2H_5)_3N$, abbreviation: TEA) gas or the like, a carbon (C)-containing gas such as a propylene ($C_3H_6$) gas or the like, a boron (B)-containing gas such as a trichloroborane ($BCl_3$) gas or the like, a phosphorus (P)-containing gas such as a phosphine ($PH_3$) gas or the like, and so forth. Even when these gases are used, the same effects as those of the embodiments and modifications described above may be obtained.

Further, in the above-described embodiments, the film-forming process performed as a process of manufacturing the semiconductor device has been given as an example of the process performed by the substrate processing apparatus. However, the present disclosure is not limited thereto. That is, the present disclosure may be suitably applied to not only the film-forming process, but also other substrate processing processes such as a process of supplying a reaction gas without supplying a precursor gas such as an oxidizing process, a nitriding process or the like. Further, the present disclosure may be suitably applied to not only the process performed as a process of manufacturing the semiconductor device, but also a process performed as a process of manufacturing a display device, a process performed as a process of manufacturing a ceramic substrate, and the like. According to these embodiments, the same effects as those of the above-described embodiments and modifications may be obtained. For example, it is possible to suppress deterioration (oxidation) of the members in the low temperature region.

The recipes used in the respective processes may be individually provided according to the process contents and stored in the memory device 121c via a telecommunication line or an external memory device 123. Then, when starting each process, the CPU 121a may appropriately select an appropriate recipe from the recipes stored in the memory device 121c according to the process contents. Thus, it becomes possible for one substrate processing apparatus to form films having various film types, composition ratios, film qualities, and film thicknesses with good reproducibility. In addition, the burden on an operator may be reduced, and each process may be started quickly while avoiding operation mistakes.

The aforementioned recipes are not limited to the newly created ones, but may be provided, for example, by changing the existing recipes already installed in the substrate processing apparatus. When changing the recipes, the changed recipes may be installed on the substrate processing apparatus via a telecommunication line or a recording medium where the recipes are recorded. Further, the input/output device 122 included in an existing substrate processing apparatus may be operated to directly change the existing recipes already installed in the substrate processing apparatus.

In the above-described embodiments, there have been described the examples in which a film is formed by using the batch type substrate processing apparatus configured to process a plurality of substrates at one time. The present disclosure is not limited to the above-described embodiments, and may be suitably applied to, for example, a case where a film is formed by using a single-substrate type substrate processing apparatus configured to process one or more substrates at a time. Further, in the above-described embodiments, there have been described the examples in which a film is formed by using the substrate processing apparatus including a hot wall type process furnace. The present disclosure is not limited to the above-described embodiments, and may be suitably applied to a case where a film is formed by using a substrate processing apparatus including a cold wall type process furnace.

Even when these substrate processing apparatuses are used, each process may be performed under the same processing procedures and processing conditions as those in the above-described embodiments, and the same effects as those in the above-described embodiments may be obtained.

In addition, the above-described embodiments, modifications, and the like may be used in combination as appropriate. The processing procedures and processing conditions at this time may be, for example, the same as the processing procedures and processing conditions in the above-described embodiments and modifications.

EXAMPLE

Figure 16:
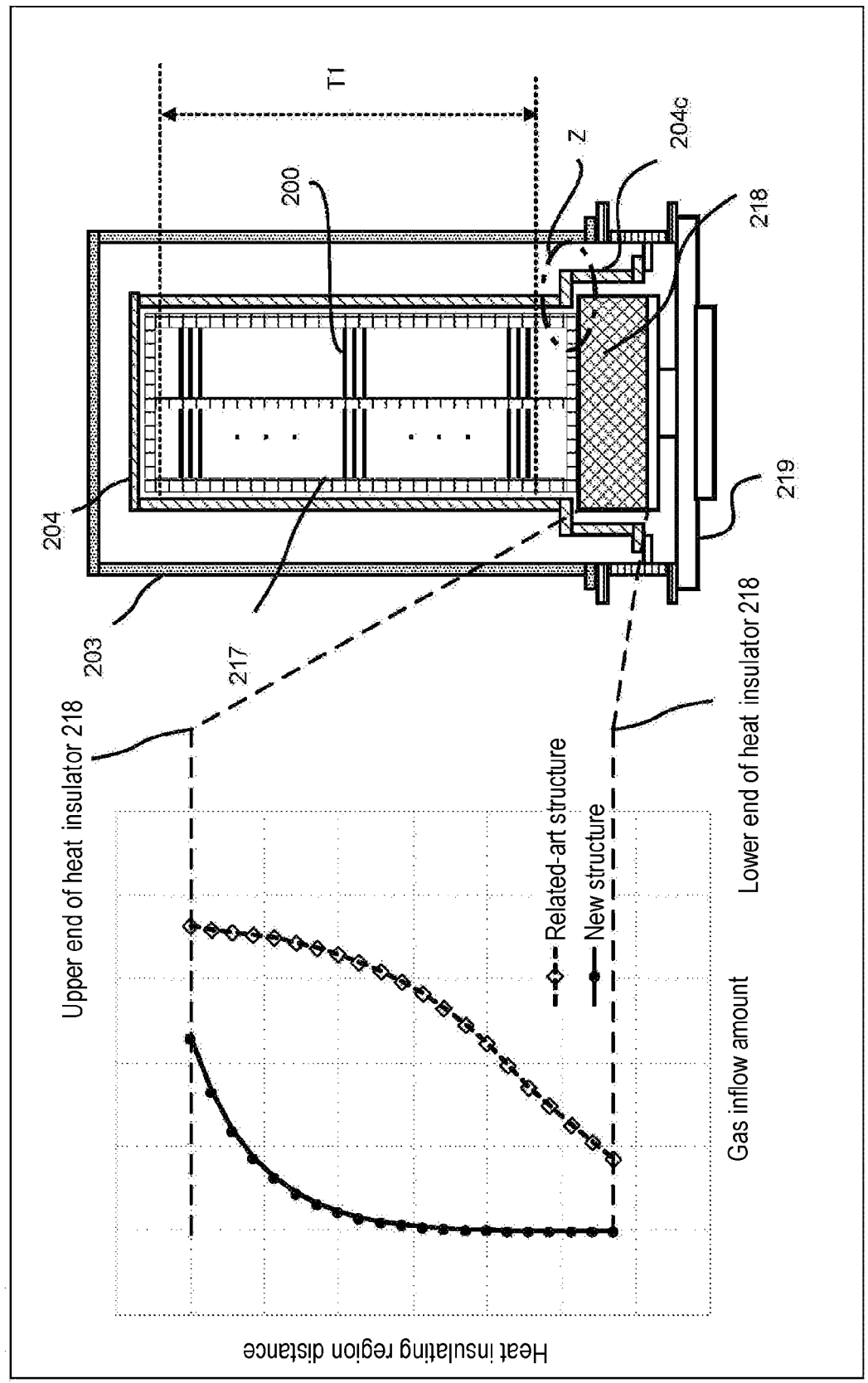
FIG. 16 is a diagram showing an example of a simulation result of an amount of a gas flowing into a low temperature region.

When the film-forming processes shown in FIGS. 14 and 15 are performed by using the substrate processing apparatus shown in FIGS. 6A and 6B and a substrate processing apparatus not provided with the protruding portion 500, simulations are conducted on the amount of the gas entering the low temperature region of the process chamber 201. Specifically, simulations are conducted on the amount of the gas (inflow amount of the gas) flowing into the space between the side surface of the heat insulator 218 and the side wall 204c (inner wall of the inner tube). FIG. 16 shows the simulation results. In FIG. 16, marks of black circle and white diamond indicate evaluation results for the substrate processing apparatus (having a new structure) shown in FIGS. 6A and 6B and evaluation results for the substrate processing apparatus (having a related-art structure) not provided with the protruding portion 500, respectively. According to FIG. 16, it may be seen that the new structure may suppress the entry of the gas into the low temperature region as compared with the related-art structure.

According to the present disclosure in some embodiments, it is possible to improve the manufacturing throughput of the substrate processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a reaction container into which a substrate support including a substrate support region configured to support a substrate and a heat insulator provided below the substrate support region are inserted;
   a gas supplier configured to supply a gas into the reaction container; and
   a protruding portion installed in an inner wall of the reaction container and protruding inward from the inner wall of the reaction container above an uppermost surface of the heat insulator to thereby at least partially overlap with the uppermost surface of the heat insulator in a plane view.

2. The substrate processing apparatus of claim 1, wherein the protruding portion is formed such that a lower end bottom surface of the protruding portion faces an outer upper surface of the heat insulator.

3. The substrate processing apparatus of claim 1, wherein a lower end bottom surface of the protruding portion is formed parallel to an outer upper surface of the heat insulator.

4. The substrate processing apparatus of claim 1, wherein the heat insulator is formed to have a diameter larger than a diameter of the substrate support.

5. The substrate processing apparatus of claim 1, wherein the protruding portion and the heat insulator are configured such that a gas flow path is formed by a space between a lower end bottom surface of the protruding portion and an outer upper surface of the heat insulator.

6. The substrate processing apparatus of claim 1, wherein a distance between a lower end bottom surface of the protruding portion and an outer upper surface of the heat insulator is shorter than a distance between an inner surface of the protruding portion and a side surface of the heat insulator.

7. The substrate processing apparatus of claim 1, wherein a distance between a lower end bottom surface of the protruding portion and an outer upper surface of the heat insulator is shorter than a distance between a side surface of the heat insulator and the inner wall of the reaction container below the protruding portion.

8. The substrate processing apparatus of claim 1, wherein a labyrinth structure is installed at a gas flow path formed by a space between a lower end bottom surface of the protruding portion and an outer upper surface of the heat insulator.

9. The substrate processing apparatus of claim 1, wherein an outer wall of the reaction container where the protruding portion is located is flush with the outer wall of the reaction container located below the protruding portion.

10. The substrate processing apparatus of claim 1, wherein an outer diameter of a portion of the reaction container where the protruding portion is located is equal to an outer diameter of a portion of the reaction container located below the protruding portion.

11. The substrate processing apparatus of claim 1, herein a thickness of a wall of the reaction container where the protruding portion is located is larger than a thickness of a wall of the reaction container located below the protruding portion.

12. The substrate processing apparatus of claim 1, wherein the inner wall of the reaction container where the protruding portion is located is formed to be closer to an edge of the substrate than the inner wall of the reaction container located below the protruding portion.

13. The substrate processing apparatus of claim 1, wherein an outer diameter of a portion of the reaction container where the protruding portion is located is smaller than an outer diameter of a portion of the reaction container located below the protruding portion.

14. The substrate processing apparatus of claim 1, wherein the protruding portion is provided over an entire circumference of the inner wall of the reaction container.

15. The substrate processing apparatus of claim 1, wherein a process chamber configured to process the substrate and a spare chamber where the gas supplier is arranged are formed inside the reaction container, and
wherein the protruding portion includes a first protruding portion provided at an inner circumference of the reaction container and a second protruding portion provided at an opening configured to bring the process chamber and the spare chamber into fluid communication with each other.

16. The substrate processing apparatus of claim 5, wherein the reaction container includes an inner tube into which the substrate support is inserted and an outer tube arranged outside the inner tube and having one end closed, and
wherein a gas vent hole configured to bring the gas flow path into fluid communication with a space between the inner tube and the outer tube is formed in the protruding portion.

17. The substrate processing apparatus of claim 1, the protruding portion is in a region where the gas supplier and the substrate support do not face each other.

18. A reaction container into which a substrate support including a substrate support region configured to support a substrate and a heat insulator provided below the substrate support region are inserted, comprising:
a protruding portion installed in an inner wall of the reaction container and protruding inward from the inner wall of the reaction container above an uppermost surface of the heat insulator to thereby at least partially overlap with the uppermost surface of the heat insulator in a plane view in the inner wall of the reaction container.

* * * * *